United States Patent
Chae et al.

(10) Patent No.: US 9,859,880 B2
(45) Date of Patent: Jan. 2, 2018

(54) DELAY CELL AND DELAY LINE HAVING THE SAME

(71) Applicant: SAMSUNG ELECTRONICS CO., LTD., Suwon-si, Gyeonggi-do (KR)

(72) Inventors: Kwan-Yeob Chae, Hwaseong-si (KR); Sang-Hoon Joo, Osan-si (KR); Sang-Hune Park, Seongnam-si (KR); Jong-Ryun Choi, Hwaseong-si (KR); Hoon-Koo Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/290,076

(22) Filed: Oct. 11, 2016

(65) Prior Publication Data
US 2017/0111033 A1    Apr. 20, 2017

(30) Foreign Application Priority Data
Oct. 14, 2015 (KR) .................. 10-2015-0143186

(51) Int. Cl.
*H03K 5/13* (2014.01)
*H03K 19/20* (2006.01)
*H03K 5/134* (2014.01)
*H03K 5/00* (2006.01)

(52) U.S. Cl.
CPC .............. *H03K 5/13* (2013.01); *H03K 5/134* (2014.07); *H03K 19/20* (2013.01); *H03K 2005/00032* (2013.01)

(58) Field of Classification Search
CPC ... H03K 5/13; H03K 19/20; H03K 205/00032
USPC .................. 327/172, 173, 174, 175, 281
See application file for complete search history.

(56) References Cited

U.S. PATENT DOCUMENTS

| | | |
|---|---|---|
| 5,883,534 A | 3/1999 | Kondoh et al. |
| 7,078,949 B2 | 7/2006 | Kim et al. |
| 7,282,974 B2 | 10/2007 | Lee |
| 7,394,300 B2 | 7/2008 | Chae |
| 7,548,104 B2 | 6/2009 | Bhowmik et al. |
| 7,994,834 B2 | 8/2011 | Ku |
| 7,994,835 B2 | 8/2011 | Chae et al. |
| 8,242,821 B2 | 8/2012 | Bae et al. |
| 8,519,758 B2 | 8/2013 | Lee et al. |

(Continued)

FOREIGN PATENT DOCUMENTS

| | | |
|---|---|---|
| KR | 2007-0121179 A | 12/2007 |
| KR | 2008-0037233 A | 4/2008 |

*Primary Examiner* — John Poos
(74) *Attorney, Agent, or Firm* — Volentine & Whitt, PLLC

(57) ABSTRACT

A delay cell includes first through fifth inversion circuits. The first inversion circuit inverts an input signal, and an output electrode of the first inversion circuit is coupled to a first node. The second inversion circuit is turned on in response to a control signal, and inverts the input signal when turned on. An output electrode of the second inversion circuit is coupled to the first node. The third inversion circuit inverts a signal at the first node, and an output electrode of the third inversion circuit is coupled to a second node. The fourth inversion circuit is turned on in response to the control signal, and inverts the signal at the first node when turned on. An output electrode of the fourth inversion circuit is coupled to the second node. The fifth inversion circuit inverts a signal at the second node to generate an output signal.

14 Claims, 18 Drawing Sheets

(56) References Cited

U.S. PATENT DOCUMENTS

| | | |
|---|---|---|
| 8,766,691 B2 | 7/2014 | Choi et al. |
| 2008/0100356 A1 | 5/2008 | Lee |
| 2008/0169855 A1 | 7/2008 | Shin et al. |
| 2012/0306554 A1* | 12/2012 | Ma .................. H03K 19/00361 327/165 |

* cited by examiner

DELAY CELL AND DELAY LINE HAVING THE SAME

CROSS-REFERENCE TO RELATED APPLICATION

A claim for priority under 35 U.S.C. §119 is made to Korean Patent Application No. 10-2015-0143186, filed on Oct. 14, 2015 in the Korean Intellectual Property Office (KIPO), the disclosure of which is incorporated herein in its entirety by reference.

BACKGROUND

The inventive concepts described herein relate to a delay line, and more particularly to a delay cell and a delay line including the delay cell.

A delay line is a circuit that delays an input signal by a desired time. Generally, a delay line includes a plurality of delay cells coupled in series. However, in the process of delaying the input signal using the plurality of delay cells, a duty cycle of the input signal may be changed by the delay line. For this reason, a conventional delay line typically includes a separate duty cycle correction circuit that corrects a duty cycle of the delayed input signal. However, the use of a separate duty cycle correction circuit increases the overall size of the delay line.

SUMMARY

Embodiments of the inventive concept are directed to providing a delay line that corrects a duty cycle of an input signal and finely controls a delay time of the input signal while being implemented in a small size.

Embodiments of the inventive concept are directed to providing a memory device including the delay line.

Embodiments of the inventive concept provide a delay cell including a first inversion circuit, a second inversion circuit, a third inversion circuit, a fourth inversion circuit, and a fifth inversion circuit. The first inversion circuit is configured to invert an input signal, and an output electrode of the first inversion circuit is coupled to a first node. The second inversion circuit is configured to be turned on in response to a control signal and to invert the input signal when turned on. An output electrode of the second inversion circuit is coupled to the first node. The third inversion circuit is configured to invert a signal at the first node, and an output electrode of the third inversion circuit is coupled to a second node. The fourth inversion circuit is configured to be turned on in response to the control signal and to invert the signal of the first node when turned on. An output electrode of the fourth inversion circuit is coupled to the second node. The fifth inversion circuit is configured to invert a signal of the second node to generate an output signal.

In embodiments of the inventive concept, the second inversion circuit includes a first inverter, a first switch, and a second switch. The first inverter is configured to invert the input signal, and an output electrode of the first inverter is the output electrode of the second inversion circuit. The first switch is coupled between a supply voltage and the first inverter, and is configured to be turned on in response to the control signal. The second switch is coupled between a ground voltage and the first inverter, and is configured to be turned on in response to the control signal. The fourth inversion circuit includes a second inverter, a third switch, and a fourth switch. The second inverter is configured to invert the signal at the first node, and an output electrode of the second inverter is the output electrode of the fourth inversion circuit. The third switch is coupled between the supply voltage and the second inverter, and is configured to be turned on in response to the control signal. The fourth switch is coupled between the ground voltage and the second inverter, and is configured to be turned on in response to the control signal.

In embodiments of the inventive concept, the second inversion circuit includes a first p-type metal oxide semiconductor (PMOS) transistor, a second PMOS transistor, a first n-type metal oxide semiconductor (NMOS) transistor, and a second NMOS transistor. The first PMOS transistor is coupled between a supply voltage and a third node, and includes a gate connected to the control signal. The second PMOS transistor is coupled between the third node and the first node, and includes a gate connected to the input signal. The first NMOS transistor is coupled between a ground voltage and a fourth node, and includes a gate connected to an inverted version of the control signal. The second NMOS transistor is coupled between the fourth node and the first node, and includes a gate connected to the input signal. The fourth inversion circuit includes a third PMOS transistor, a fourth PMOS transistor, a third NMOS transistor, and a fourth NMOS transistor. The third PMOS transistor is coupled between the supply voltage and a fifth node, and includes a gate connected to the control signal. The fourth PMOS transistor is coupled between the fifth node and the second node, and includes a gate coupled to the first node. The third NMOS transistor is coupled between the ground voltage and a sixth node, and includes a gate connected to the inverted version of the control signal. The fourth NMOS transistor is coupled between the sixth node and the second node, and includes a gate coupled to the first node.

Embodiments of the inventive concept provide a delay line including a duty cycle adjust circuit, a fine delay circuit, and a coarse delay circuit. The duty cycle adjust circuit is configured to adjust a duty cycle of an input signal based on a first control signal and a second control signal, and to invert the input signal to generate a first internal signal. The fine delay circuit is configured to delay the first internal signal based on a third control signal, and to invert the first internal signal to generate a second internal signal. The coarse delay circuit is configured to delay the second internal signal based on a fourth control signal to generate an output signal.

In embodiments of the inventive concept, the duty cycle adjust circuit includes at least one delay cell coupled in series, and the at least one delay cell operates based on the first control signal and the second control signal. The fine delay circuit includes a plurality of delay cells coupled in series, and the plurality of delay cells operate based on the third control signal. Each of a number of the at least one delay cell included in the duty cycle adjust circuit and a number of the plurality of delay cells included in the fine delay circuit correspond to an odd number. The at least one delay cell included in the duty cycle adjust circuit and each of the plurality of delay cells included in the fine delay circuit have a same structure.

In embodiments of the inventive concept, each of the at least one delay cell included in the duty cycle adjust circuit is configured to independently adjust a delay time of a rising edge and a delay time of a falling edge of a received signal based on the first control signal and the second control signal. Each of the plurality of delay cells included in the fine delay circuit is configured to equally adjust a delay time of a rising edge and a delay time of a falling edge of a received signal based on the third control signal.

In embodiments of the inventive concept, each of a number of bits included in the first control signal and a number of bits included in the second control signal is the same as the number of the at least one delay cell included in the duty cycle adjust circuit, and each of the at least one delay cell included in the duty cycle adjust circuit receives a respective bit of the first control signal and a respective bit of the second control signal. A number of bits included in the third control signal is the same as the number of the plurality of delay cells included in the fine delay circuit, and each of the plurality of delay cells included in the fine delay circuit receives a respective bit of the third control signal.

In embodiments of the inventive concept, each of the at least one delay cell included in the duty cycle adjust circuit includes a first inversion circuit, a second inversion circuit, a third inversion circuit, a fourth inversion circuit, and a fifth inversion circuit. The first inversion circuit is configured to invert an internal input signal, and an output electrode of the first inversion circuit is coupled to a first node. The second inversion circuit is configured to selectively invert a rising edge of the internal input signal and a falling edge of the internal input signal based on the first control signal and the second control signal, and an output electrode of the second inversion circuit is coupled to the first node. The third inversion circuit is configured to invert a signal at the first node, and an output electrode of the third inversion circuit is coupled to a second node. The fourth inversion circuit is configured to selectively invert a rising edge of the signal at the first node and a falling edge of the signal at the first node based on the first control signal and the second control signal, and an output electrode of the fourth inversion circuit is coupled to the second node. The fifth inversion circuit is configured to invert a signal of the second node to generate an internal output signal.

In embodiments of the inventive concept, the second inversion circuit includes a first inverter, a first switch, and a second switch. The first inverter is configured to invert the internal input signal, and an output electrode of the first inverter is the output electrode of the second inversion circuit. The first switch is coupled between a supply voltage and the first inverter, and is configured to be turned on in response to the first control signal. The second switch is coupled between a ground voltage and the first inverter, and is configured to be turned on in response to the second control signal. The fourth inversion circuit includes a second inverter, a third switch, and a fourth switch. The second inverter is configured to invert the signal at the first node, and an output electrode of the second inverter is the output electrode of the fourth inversion circuit. The third switch is coupled between the supply voltage and the second inverter, and is configured to be turned on in response to the second control signal. The fourth switch is coupled between the ground voltage and the second inverter, and is configured to be turned on in response to the first control signal.

In embodiments of the inventive concept, the second inversion circuit includes a first p-type metal oxide semiconductor (PMOS) transistor, a second PMOS transistor, a first n-type metal oxide semiconductor (NMOS) transistor, and a second NMOS transistor. The first PMOS transistor is coupled between a supply voltage and a third node, and includes a gate connected to the first control signal. The second PMOS transistor is coupled between the third node and the first node, and includes a gate connected to the internal input signal. The first NMOS transistor is coupled between a ground voltage and a fourth node, and includes a gate connected to an inverted version of the second control signal. The second NMOS transistor is coupled between the fourth node and the first node, and includes a gate connected to the internal input signal. The fourth inversion circuit includes a third PMOS transistor, a fourth PMOS transistor, a third NMOS transistor, and a fourth NMOS transistor. The third PMOS transistor is coupled between the supply voltage and a fifth node, and includes a gate connected to the second control signal. The fourth PMOS transistor is coupled between the fifth node and the second node, and includes a gate coupled to the first node. The third NMOS transistor is coupled between the ground voltage and a sixth node, and includes a gate connected to an inverted version of the first control signal. The fourth NMOS transistor is coupled between the sixth node and the second node, and includes a gate coupled to the first node.

In embodiments of the inventive concept, each of the plurality of delay cells included in the fine delay circuit includes a first inversion circuit, a second inversion circuit, a third inversion circuit, a fourth inversion circuit, and a fifth inversion circuit. The first inversion circuit is configured to invert an internal input signal, and an output electrode of the first inversion circuit is coupled to a first node. The second inversion circuit is configured to be turned on in response to the third control signal, and to invert the internal input signal when turned on. An output electrode of the second inversion circuit is coupled to the first node. The third inversion circuit is configured to invert a signal at the first node, and an output electrode of the third inversion circuit is coupled to a second node. The fourth inversion circuit is configured to be turned on in response to the third control signal, and to invert the signal at the first node when turned on. An output electrode of the fourth inversion circuit is coupled to the second node. The fifth inversion circuit is configured to invert a signal of the second node to generate an internal output signal.

In embodiments of the inventive concept, the second inversion circuit include a first inverter, a first switch, and a second switch. The first inverter is configured to invert the internal input signal, and an output electrode of the first inverter is the output electrode of the second inversion circuit. The first switch is coupled between a supply voltage and the first inverter, and is configured to be turned on in response to the third control signal. The second switch is coupled between a ground voltage and the first inverter, and is configured to be turned on in response to the third control signal. The fourth inversion circuit includes a second inverter, a third switch, and a fourth switch. The second inverter is configured to invert the signal of the first node, and an output electrode of the second inverter is coupled to the second node. The third switch is coupled between the supply voltage and the second inverter, and is configured to be turned on in response to the third control signal. The fourth switch is coupled between the ground voltage and the second inverter, and is configured to be turned on in response to the third control signal.

In embodiments of the inventive concept, the second inversion circuit includes a first p-type metal oxide semiconductor (PMOS) transistor, a second PMOS transistor, a first n-type metal oxide semiconductor (NMOS) transistor, and a second NMOS transistor. The first PMOS transistor is coupled between a supply voltage and a third node, and includes a gate connected to the third control signal. The second PMOS transistor is coupled between the third node and the first node, and includes a gate connected to the internal input signal. The first NMOS transistor is coupled between a ground voltage and a fourth node, and includes a gate connected to an inverted version of the third control signal. The second NMOS transistor is coupled between the fourth node and the first node, and includes a gate connected to the internal input signal. The fourth inversion circuit includes a third PMOS transistor, a fourth PMOS transistor, a third NMOS transistor, and a fourth NMOS transistor. The third PMOS transistor is coupled between the supply voltage and a fifth node, and includes a gate connected to the third control signal. The fourth PMOS transistor is coupled between the fifth node and the second node, and includes a gate coupled to the first node. The third NMOS transistor is coupled between the ground voltage and a sixth node, and includes a gate connected to the inverted version of the third control signal. The fourth NMOS transistor is coupled between the sixth node and the second node, and includes a gate coupled to the first node.

In embodiments of the inventive concept, the fine delay circuit is configured to adjust a delay time of the first internal signal by units of a first unit delay based on the third control signal, and the coarse delay circuit is configured to adjust a delay time of the second internal signal by units of a second unit delay which is longer than the first unit delay, based on the fourth control signal.

In embodiments of the inventive concept, the number of the plurality of delay cells included in the fine delay circuit is P, the second unit delay is D, and the first unit delay corresponds to $D/(P+1)$.

Embodiments of the inventive concept provide a delay cell including a first inversion circuit, a second inversion circuit, a third inversion circuit, a fourth inversion circuit, and a fifth inversion circuit. The first inversion circuit is configured to invert an input signal, and an output electrode of the first inversion circuit is coupled to a first node. The second inversion circuit is configured to selectively invert a rising edge of the input signal and a falling edge of the input signal based on a first control signal and a second control signal. An output electrode of the second inversion circuit is coupled to the first node. The third inversion circuit is configured to invert a signal at the first node, and an output electrode of the third inversion circuit is coupled to a second node. The fourth inversion circuit is configured to selectively invert a rising edge of the signal at the first node and a falling edge of the signal at the first node based on the first control signal and the second control signal. An output electrode of the fourth inversion circuit is coupled to the second node. The fifth inversion circuit is configured to invert a signal of the second node to generate an output signal.

BRIEF DESCRIPTION OF THE DRAWINGS

Example embodiments of the inventive concept will be more clearly understood from the following detailed description taken in conjunction with the accompanying drawings.

DETAILED DESCRIPTION OF THE EMBODIMENTS

Figure 1:
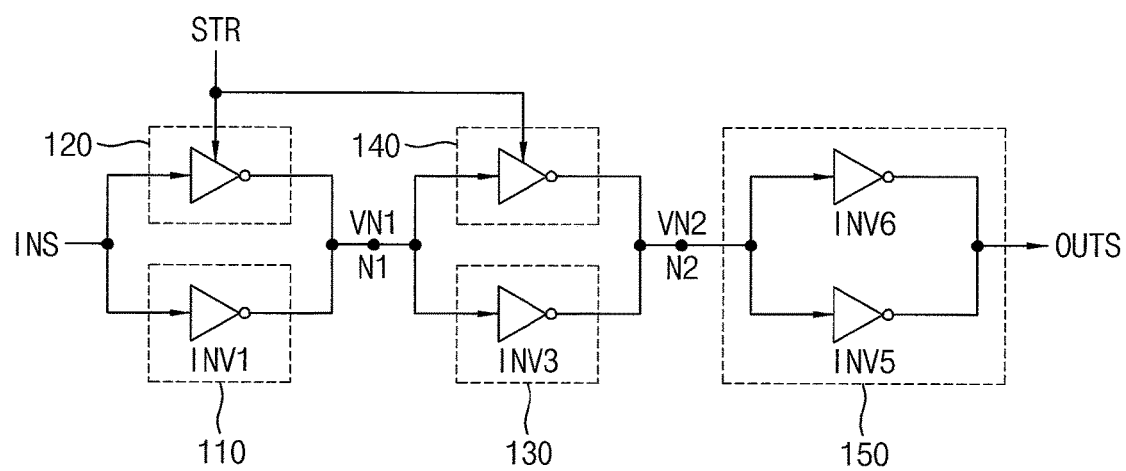
FIG. 1 illustrates a block diagram of a delay cell according to example embodiments of the inventive concept.

Various example embodiments of the inventive concept will be described more fully with reference to the accompanying drawings, in which some example embodiments are shown. The present inventive concept may, however, be embodied in many different forms and should not be construed as limited to the embodiments set forth herein. Rather, these embodiments are provided so that this disclosure will be thorough and complete, and will fully convey the scope of the present inventive concept to those skilled in the art. Like reference numerals refer to like elements throughout this application.

It should be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present inventive concept. As used herein, the term "and/or" includes any and all combinations of one or more of the associated listed items.

It should be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the inventive concept. As used herein, the singular forms "a," "an" and "the" are intended to include the plural forms as well, unless the context clearly indicates otherwise. It should be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

FIG. 1 illustrates a block diagram of a delay cell according to example embodiments of the inventive concept.

Referring to FIG. 1, delay cell 100 includes a first inversion circuit 110, a second inversion circuit 120, a third inversion circuit 130, a fourth inversion circuit 140, and a fifth inversion circuit 150.

The first inversion circuit 110 inverts the input signal INS. An output electrode of the first inversion circuit 110 is coupled to a first node N1. The first inversion circuit 110 inverts the input signal INS and outputs an inverted signal to the first node N1. In some example embodiments, the first inversion circuit 110 may include a first inverter INV1.

The second inversion circuit 120 is turned on in response to a control signal STR. When the second inversion circuit 120 is turned on in response to the control signal STR, the second inversion circuit 120 inverts the input signal INS. An output electrode of the second inversion circuit 120 is coupled to the first node N1. The second inversion circuit 120 outputs the inverted signal to the first node N1.

Figure 2:
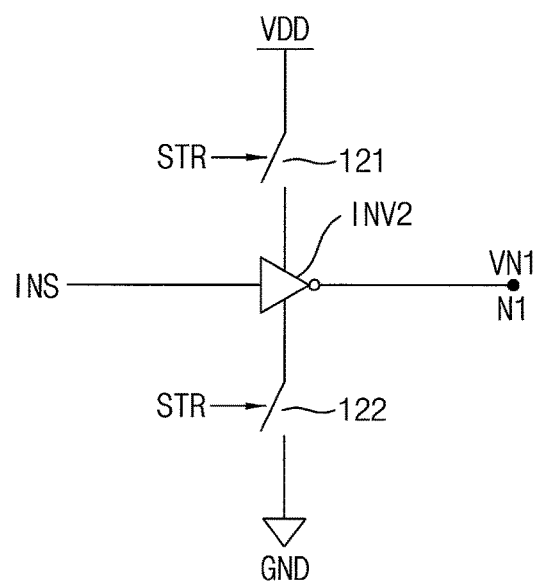
FIG. 2 illustrates a block diagram of an example of a second inversion circuit included in the delay cell of FIG. 1.

FIG. 2 illustrates a block diagram of an example of second inversion circuit 120 included in the delay cell of FIG. 1.

Referring to FIG. 2, the second inversion circuit 120 includes a second inverter INV2, a first switch 121, and a second switch 122.

The first switch 121 is coupled between a supply voltage VDD and the second inverter INV2. The second switch 122 is coupled between a ground voltage GND and the second inverter INV2. The first switch 121 and the second switch 122 are turned on in response to the control signal STR. For example, the first switch 121 and the second switch 122 may be turned on when the control signal STR has a first logic level, and turned off when the control signal STR has a second logic level.

When the first switch 121 and the second switch 122 are turned off in response to a logic level of the control signal STR, the second inverter INV2 is turned off and the first node N1 is therefore placed in a floating state.

When the first switch 121 and the second switch 122 are turned on in response to a logic level of the control signal STR, the second inverter INV2 is turned on such that the second inverter INV2 may invert the input signal INS and output the inverted signal to the first node N1.

Referring again to FIG. 1, the third inversion circuit 130 inverts a signal VN1 present at the first node N1. An output electrode of the third inversion circuit 130 is coupled to a second node N2. The third inversion circuit 130 inverts the signal VN1 and outputs the inverted signal to the second node N2. In some example embodiments, the third inversion circuit 130 may include a third inverter INV3.

The fourth inversion circuit 140 is turned on in response to the control signal STR. When the fourth inversion circuit 140 is turned on in response to the control signal STR, the fourth inversion circuit 140 inverts the signal VN1 of the first node N1. An output electrode of the fourth inversion circuit 140 is coupled to the second node N2. The fourth inversion circuit 140 outputs the inverted signal to the second node N2.

Figure 3:
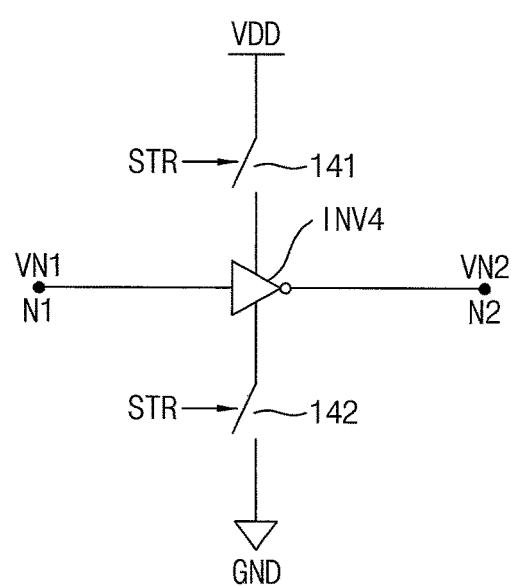
FIG. 3 illustrates a block diagram of an example of a fourth inversion circuit included in the delay cell of FIG. 1.

FIG. 3 illustrates a block diagram of an example of fourth inversion circuit 140 included in the delay cell of FIG. 1.

Referring to FIG. 3, the fourth inversion circuit 140 includes a fourth inverter INV4, a third switch 141, and a fourth switch 142.

The third switch 141 is coupled between the supply voltage VDD and the fourth inverter INV4. The fourth switch 142 is coupled between the ground voltage GND and the fourth inverter INV4. The third switch 141 and the fourth switch 142 are turned on in response to the control signal STR. For example, the third switch 141 and the fourth switch 142 may be turned on when the control signal STR has the first logic level, and be turned off when the control signal STR has the second logic level.

When the third switch 141 and the fourth switch 142 are turned off in response to a logic level of the control signal STR, the fourth inverter INV4 is turned off and the second node N2 is therefore placed in a floating state.

When the third switch 141 and the fourth switch 142 are turned on in response to a logic level of the control signal STR, the fourth inverter INV4 is turned and inverts the signal VN1 of the first node N1 and outputs the inverted signal to the second node N2.

Referring again to FIG. 1, the fifth inversion circuit 150 inverts a signal VN2 at the second node N2 to generate an output signal OUTS. Although FIG. 1 illustrates that the fifth inversion circuit 150 includes a fifth inverter INV5 and a sixth inverter INV6 coupled in parallel, example embodiments are not limited thereto. According to example embodiments, the fifth inversion circuit 150 may include any number of inverters coupled in parallel.

As described above with reference to FIGS. 1 to 3, the output signal OUTS may correspond to an inverted version of the input signal INS. In addition, as will be subsequently described, a delay time between the input signal INS and the output signal OUTS, or in other words the delay time of delay cell 100 corresponding to the time required to propagate input signal INS provided at the input of delay cell 100 to provide output signal OUTS at the output of delay cell 100, may be varied based on the logic level of the control signal STR.

Figure 4:
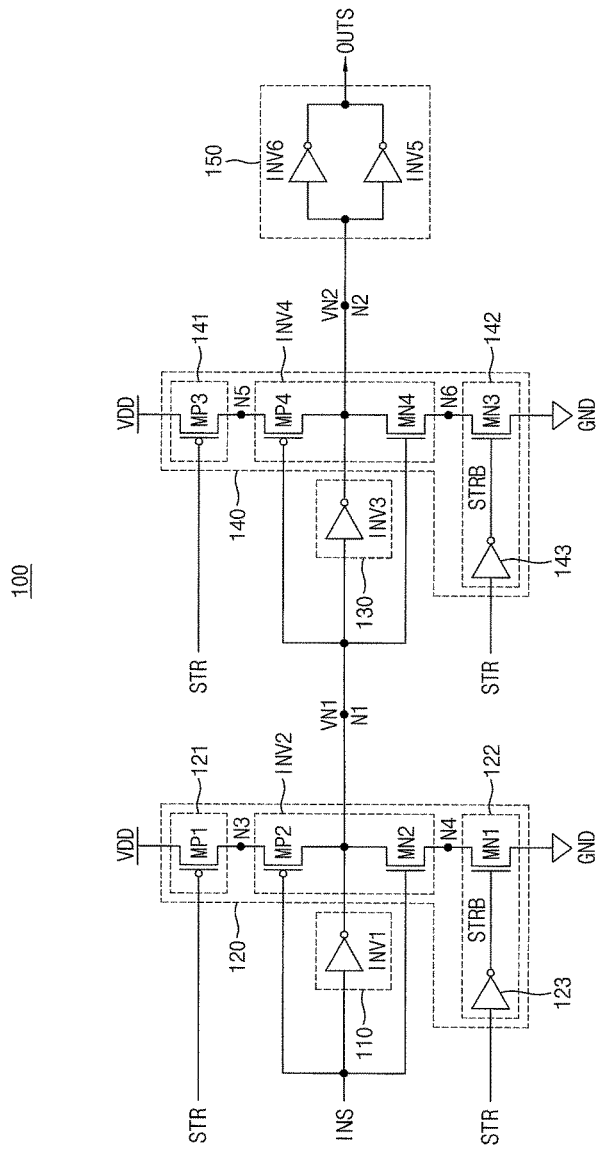
FIG. 4 illustrates a circuit diagram of an example of the delay cell of FIG. 1.

FIG. 4 illustrates a circuit diagram of an example of the delay cell 100 of FIG. 1.

In FIG. 4, a detailed structure of the second inversion circuit 120 of FIG. 2 and a detailed structure of the fourth inversion circuit 140 of FIG. 3 are illustrated.

Referring to FIG. 4, the second inversion circuit 120 includes a first p-type metal oxide semiconductor (PMOS) transistor MP1, a second PMOS transistor MP2, a first n-type metal oxide semiconductor (NMOS) transistor MN1, a second NMOS transistor MN2, and an inverter 123.

The first PMOS transistor MP1 includes a source coupled to the supply voltage VDD, a drain coupled to a third node N3, and a gate receiving (connected to) the control signal STR.

The second PMOS transistor MP2 includes a source coupled to the third node N3, a drain coupled to the first node N1, and a gate connected to the input signal INS.

The inverter 123 inverts the control signal STR to generate an inverted control signal STRB.

The first NMOS transistor MN1 includes a source coupled to the ground voltage GND, a drain coupled to a fourth node N4, and a gate connected to the inverted control signal STRB.

The second NMOS transistor MN2 includes a source coupled to the fourth node N4, a drain coupled to the first node N1, and a gate connected to the input signal INS.

Referring to FIGS. 2 and 4, the first switch 121 corresponds to the first PMOS transistor MP1, the second switch 122 corresponds to the inverter 123 and the first NMOS transistor MN1, and the second inverter INV2 corresponds to the second PMOS transistor MP2 and the second NMOS transistor MN2.

According to some embodiments of the inventive concept, when both the control signal STR and the inverted control signal STRB which corresponds to an inverted version of the control signal STR are provided from outside (externally provided), the inverter 123 may be omitted from the second inversion circuit 120 and the inverted control signal STRB may be directly applied to the gate of the first NMOS transistor MN1.

The fourth inversion circuit 140 includes a third PMOS transistor MP3, a fourth PMOS transistor MP4, a third NMOS transistor MN3, a fourth NMOS transistor MN4, and an inverter 143.

The third PMOS transistor MP3 includes a source coupled to the supply voltage VDD, a drain coupled to a fifth node N5, and a gate connected to the control signal STR.

The fourth PMOS transistor MP4 includes a source coupled to the fifth node N5, a drain coupled to the second node N2, and a gate connected to the first node N1.

The inverter 143 invert the control signal STR to generate the inverted control signal STRB.

The third NMOS transistor MN3 includes a source coupled to the ground voltage GND, a drain coupled to a sixth node N6, and a gate connected to the inverted control signal STRB.

The fourth NMOS transistor MN4 includes a source coupled to the sixth node N6, a drain coupled to the second node N2, and a gate connected to the first node N1.

Referring to FIGS. 3 and 4, the third switch 141 corresponds to the third PMOS transistor MP3, the fourth switch 142 corresponds to the inverter 143 and the third NMOS transistor MN3, and the fourth inverter INV4 corresponds to the fourth PMOS transistor MP4 and the fourth NMOS transistor MN4.

According to some embodiments of the inventive concept, the inverter 143 may be omitted from the fourth inversion circuit 140 and the inverted control signal STRB output by the inverter 123 may be applied to the gate of the third NMOS transistor MN3.

According to some embodiments of the inventive concept, when both the control signal STR and the inverted control signal STRB which corresponds to an inverted version of the control signal STR are provided from outside, the inverter 143 may be omitted from the fourth inversion circuit 140 and the inverted control signal STRB may be directly applied to the gate of the third NMOS transistor MN3.

Figure 5:
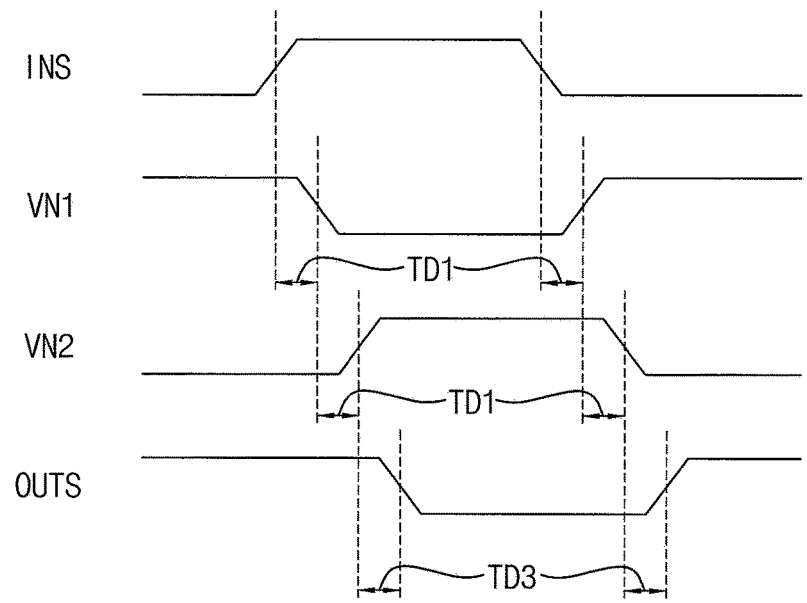
FIGS. 5 and 6 illustrate diagrams for describing an operation of the delay cell of FIG. 4.
Figure 6:
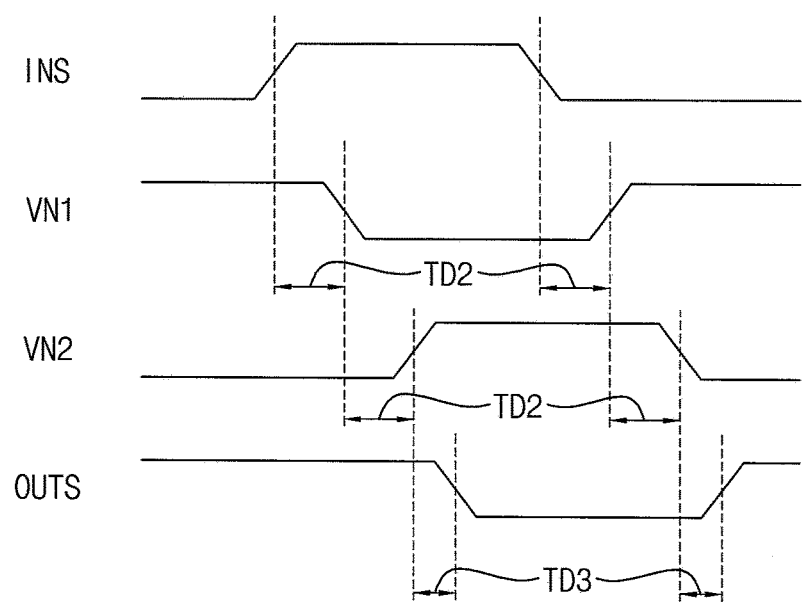

FIGS. 5 and 6 illustrate diagrams for describing an operation of the delay cell 100 of FIG. 4.

FIG. 5 represents an operation of the delay cell 100 when the control signal STR has a logic low level, and FIG. 6 represents an operation of the delay cell 100 when the control signal STR has a logic high level.

Referring to FIGS. 4 and 5, when the control signal STR has a logic low level, the second inversion circuit 120 and the fourth inversion circuit 140 are turned on.

Therefore, when the input signal INS transitions to a logic high level, the signal VN1 of the first node N1 may transition to a logic low level after a first delay time TD1 by operation of the first inverter INV1 and the second inverter INV2.

When the signal VN1 of the first node N1 transitions to a logic low level, the signal VN2 of the second node N2 may transition to a logic high level after the first delay time TD1 by operation of the third inverter INV3 and the fourth inverter INV4.

When the signal VN2 of the second node N2 transitions to a logic high level, the output signal OUTS may transition to a logic low level after a third delay time TD3 by operation of the fifth inversion circuit 150.

Similarly, when the input signal INS transitions to a logic low level, the signal VN1 of the first node N1 may transition to a logic high level after the first delay time TD1 by operation of the first inverter INV1 and the second inverter INV2.

When the signal VN1 of the first node N1 transitions to a logic high level, the signal VN2 of the second node N2 may transition to a logic low level after the first delay time TD1 by operation of the third inverter INV3 and the fourth inverter INV4.

When the signal VN2 of the second node N2 transitions to a logic low level, the output signal OUTS may transition to a logic high level after the third delay time TD3 by operation of the fifth inversion circuit 150.

Therefore, as illustrated in FIG. 5, when the control signal STR has a logic low level, the delay cell 100 outputs the output signal OUTS, which corresponds to an inverted version of the input signal INS, after a delay time of (2*TD1+TD3) subsequent input of the input signal INS.

On the other hand, referring to FIGS. 4 and 6, when the control signal STR has a logic high level, the second inversion circuit 120 and the fourth inversion circuit 140 are turned off.

Therefore, when the input signal INS transitions to a logic high level, the signal VN1 of the first node N1 may transition to a logic low level after a second delay time TD2, which is longer than the first delay time TD1, by operation of only the first inverter INV1.

When the signal VN1 of the first node N1 transitions to a logic low level, the signal VN2 of the second node N2 may transition to a logic high level after the second delay time TD2 by operation of only the third inverter INV3.

When the signal VN2 of the second node N2 transitions to a logic high level, the output signal OUTS may transition to a logic low level after the third delay time TD3 by operation of the fifth inversion circuit 150.

Similarly, when the input signal INS transitions to a logic low level, the signal VN1 of the first node N1 may transition to a logic high level after the second delay time TD2 by operation of only the first inverter INV1.

When the signal VN1 of the first node N1 transitions to a logic high level, the signal VN2 of the second node N2 may transition to a logic low level after the second delay time TD2 by operation of only the third inverter INV3.

When the signal VN2 of the second node N2 transitions to a logic low level, the output signal OUTS may transition to a logic high level after the third delay time TD3 by operation of the fifth inversion circuit 150.

Therefore, as illustrated in FIG. 6, when the control signal STR has a logic high level, the delay cell 100 outputs the output signal OUTS, which corresponds to an inverted version of the input signal INS, after a delay time of (2*TD2+TD3) subsequent input of the input signal INS.

As described above with reference to FIGS. 1 to 6, when the control signal STR has a logic low level, the second inversion circuit 120 and the fourth inversion circuit 140 are turned on. Therefore, the input signal INS may be transferred to the first node N1 by operation of the first inverter INV1 and the second inverter INV2, and the signal VN1 of the first node N1 may be transferred to the second node N2 by operation of the third inverter INV3 and the fourth inverter INV4. Since the input signal INS is transferred to the second node N2 relatively rapidly by operation of both first and second inverters INV1 and INV2 and by operation of both third and fourth inverters INV3 and INV4, a delay time of the delay cell 100 may decrease.

On the other hand, when the control signal STR has a logic high level, the second inversion circuit 120 and the fourth inversion circuit 140 are turned off. Therefore, the input signal INS may be transferred to the first node N1 by operation of only the first inverter INV1, and the signal VN1 of the first node N1 may be transferred to the second node N2 by operation of only the third inverter INV3. Since the input signal INS is transferred to the second node N2 relatively slowly, the delay time of the delay cell 100 may increase.

Therefore, the delay cell 100 may effectively control a delay time of the input signal INS based on the logic level of the control signal STR.

In addition, according to a manufacturing process of a complementary metal oxide semiconductor (CMOS) transistors, a current driving ability of a PMOS transistor may be different from a current driving ability of an NMOS transistor. Therefore, when an input signal is delayed using a CMOS transistor, a delay time of a rising edge of the input signal may be different from a delay time of a falling edge of the input signal, such that a duty cycle error may occur in the delayed input signal.

However, the delay cell 100 according to example embodiments of the inventive concept inverts the input signal INS using a pair of the first inversion circuit 110 and the second inversion circuit 120 to output the inverted signal to the first node N1, and inverts the signal VN1 of the first node N1 using a pair of the third inversion circuit 130 and the fourth inversion circuit 140 to output the inverted signal to the second node N2. The pair of the third inversion circuit 130 and the fourth inversion circuit 140 has a same structure as the pair of the first inversion circuit 110 and the second inversion circuit 120. Therefore, a duty cycle error component that occurs by the pair of the third inversion circuit 130 and the fourth inversion circuit 140 cancels out a duty cycle error component that occurs by the pair of the first inversion circuit 110 and the second inversion circuit 120.

Therefore, the delay cell 100 according to example embodiments may effectively prevent an occurrence of a duty cycle error.

Figure 7:
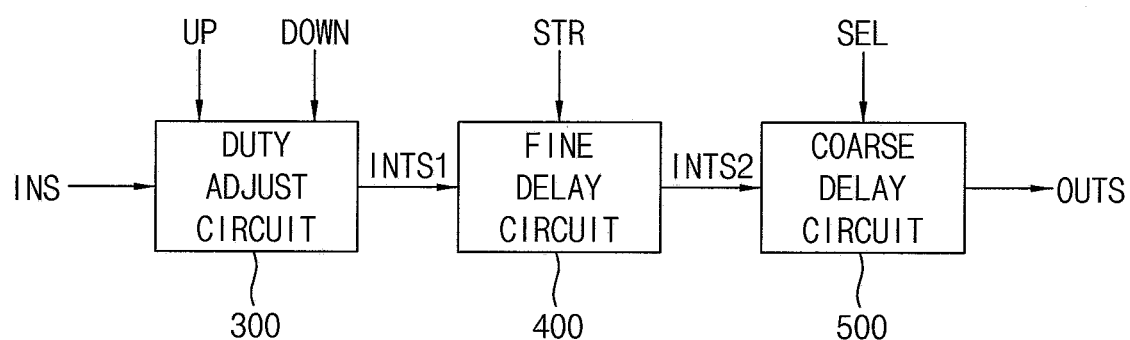
FIG. 7 illustrates a block diagram of a delay line according to example embodiments of the inventive concept.

FIG. 7 is a block diagram illustrating a delay line according to example embodiments of the inventive concept.

Referring to FIG. 7, delay line 200 includes a duty cycle adjust circuit 300, a fine delay circuit 400, and a coarse delay circuit 500.

The duty cycle adjust circuit 300 adjusts a duty cycle of an input signal INS and inverts the input signal INS to generate a first internal signal INTS1 based on a first control signal UP (up) and a second control signal DN (down).

The fine delay circuit 400 delays the first internal signal INTS1 by a delay time determined based on a third control signal STR and inverts the first internal signal INTS1 to generate a second internal signal INTS2. For example, the fine delay circuit 400 may adjust a delay time of the first internal signal INTS1 by units of a first unit delay based on the third control signal STR.

The coarse delay circuit 500 delays the second internal signal INTS2 by a delay time determined based on a fourth control signal SEL to generate an output signal OUTS. For example, the coarse delay circuit 500 may adjust a delay time of the second internal signal INTS2 by units of a second unit delay, which is greater than the first unit delay, based on the fourth control signal SEL.

Therefore, the delay line 200 according to example embodiments of the inventive concept may adjust the duty cycle of the input signal INS based on the first control signal UP and the second control signal DN, coarsely adjust a delay time of the input signal INS based on the fourth control signal SEL, and finely adjust the delay time of the input signal INS based on the third control signal STR.

In addition, as will be subsequently described, the duty cycle adjust circuit 300 may be implemented using a delay cell 100 of FIG. 1, and the fine delay circuit 400 may be implemented using a delay cell 100 of FIG. 1. That is, the duty cycle adjust circuit 300 and the fine delay circuit 400 may be implemented using respective circuits that are structured the same (i.e., respective delay cells 100 of FIG. 1), whereby the corresponding delay cells 100 operate differently based on control signals provided to the duty cycle adjust circuit 300 and the fine delay circuit 400.

Therefore, for example, the delay line 200 according to example embodiments of the inventive concept may correct the duty cycle of the input signal INS using a delay cell in the duty cycle adjust circuit 300 that has the same structure as the delay cell included in the fine delay circuit 400, without using a separate duty cycle correction device. As such, the delay line 200 may correct the duty cycle of the input signal INS and finely control the delay time of the input signal INS, while at the same time being implemented in a relatively small size.

Figure 8:
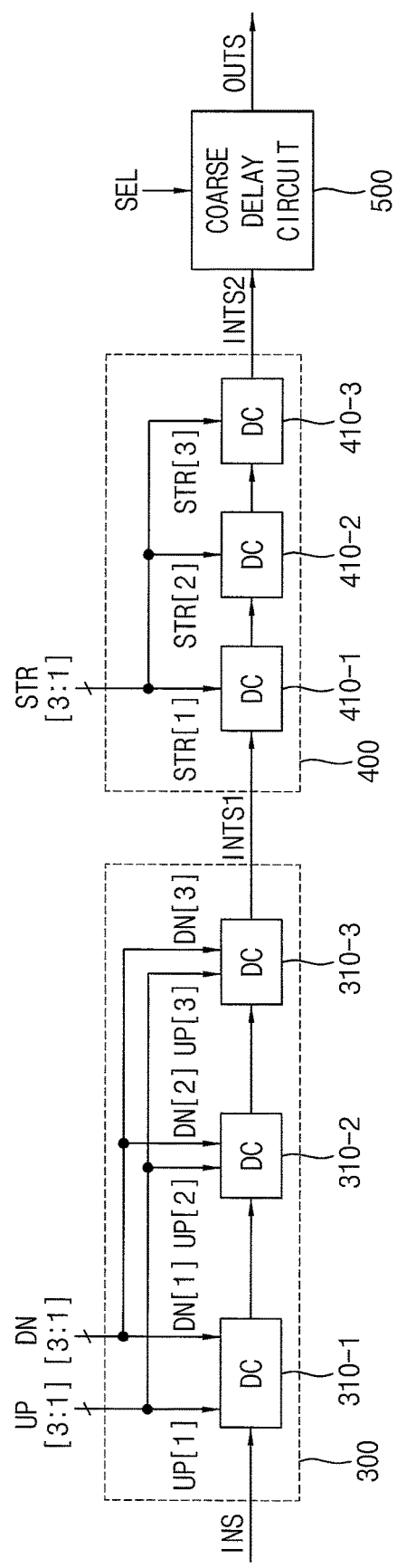
FIG. 8 illustrates a block diagram of an example of the delay line of FIG. 7.

FIG. 8 illustrates a block diagram of an example of the delay line 200 of FIG. 7.

Referring to FIG. 8, the duty cycle adjust circuit 300 included in the delay line 200 includes at least one delay cell DC. In particular, duty cycle adjust circuit 300 includes at least one of delay cells 310-1, 310-2, and 310-3. That is, in some embodiments of the inventive concept duty cycle adjust circuit 300 may include two of the delay cells 310-1, 310-2 and 310-3 coupled in series, and in other embodiments duty cycle adjust circuit 300 may include all of the delay cells 310-1, 310-2 and 310-3 coupled in series. The at least one delay cells 310-1, 310-2, and 310-3 may operate based on the first control signal UP[3:1] and the second control signal DN[3:1].

The number of bits included in the first control signal UP[3:1] and the number of bits included in the second control signal DN[3:1] are the same as the number of the at least one delay cells 310-1, 310-2, and 310-3 included in the duty cycle adjust circuit 300. Each of the at least one delay cells 310-1, 310-2, and 310-3 included in the duty cycle adjust circuit 300 receives a respective bit of the first control signal UP[3:1] and a respective bit of the second control signal DN[3:1]. For example, the delay cell 310-1 receives a first bit UP[1] of the first control signal UP[3:1] and a first bit DN[1] of the second control signal DN[3:1], the delay cell 310-2 receives a second bit UP[2] of the first control signal UP[3:1] and a second bit DN[2] of the second control signal DN[3:1], and the delay cell 310-3 receives a third bit UP[3] of the first control signal UP[3:1] and a third bit DN[3] of the second control signal DN[3:1].

In some example embodiments, the number of the at least one delay cells 310-1, 310-2, and 310-3 included in the duty cycle adjust circuit 300 may correspond to an odd number. In FIG. 8, the duty cycle adjust circuit 300 is illustrated as including three delay cells 310-1, 310-2, and 310-3 as an example. However, example embodiments are not limited thereto. For example, in some embodiments of the inventive concept duty cycle adjust circuit 300 may include more delay cells coupled in series than the three delay cells 310-1, 310-2 and 310-3.

Each of the at least one delay cells 310-1, 310-2, and 310-3 included in the duty cycle adjust circuit 300 may adjust a duty cycle of a received signal by independently adjusting a delay time of a rising edge of the received signal and a delay time of a falling edge of the received signal based on the first control signal UP[3:1] and the second control signal DN[3:1].

Figure 9:
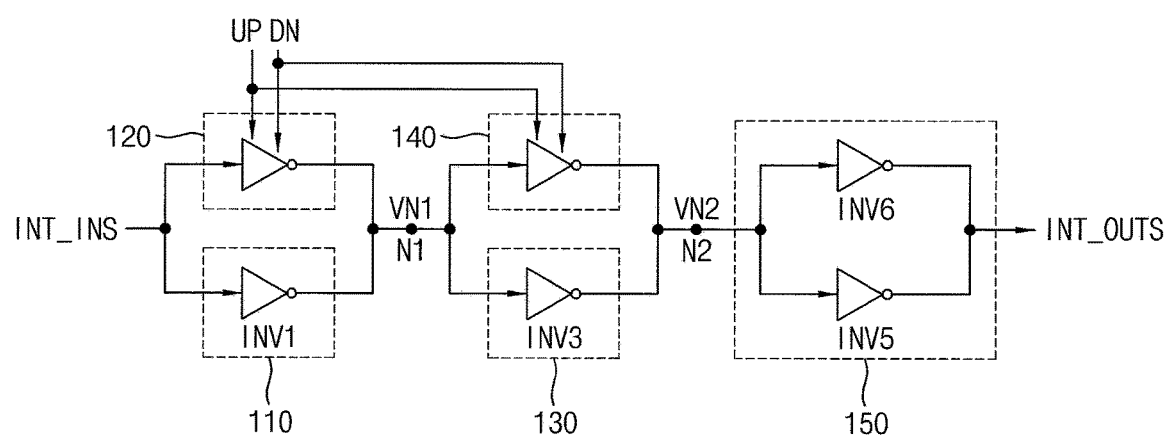
FIG. 9 illustrates a block diagram of an example of a delay cell included in a duty cycle adjust circuit of FIG. 8.

FIG. 9 illustrates a block diagram of an example of a delay cell included in a duty cycle adjust circuit of FIG. 8.

Each of the at least one delay cells 310-1, 310-2, and 310-3 included in the duty cycle adjust circuit 300 of FIG. 8 may be implemented by a delay cell 310 of FIG. 9.

Referring to FIG. 9, the delay cell 310 includes a first inversion circuit 110, a second inversion circuit 120, a third inversion circuit 130, a fourth inversion circuit 140, and a fifth inversion circuit 150.

The first inversion circuit 110 inverts an internal input signal INT_INS. In the case that delay cell 310 corresponds to delay cell 310-1 of FIG. 8, the internal input signal INT_INS in FIG. 9 corresponds to input signal INS as shown in FIG. 8. In the case that delay cell 310 corresponds to either of delay cells 310-2 or 310-3 of FIG. 8, the internal input signal INT_INS in FIG. 9 corresponds to the output of the previous serially connected delay cell. An output electrode of the first inversion circuit 110 is coupled to a first node N1. Therefore, the first inversion circuit 110 outputs the inverted signal to the first node N1. In some example embodiments, the first inversion circuit 110 may include a first inverter INV1.

The second inversion circuit 120 selectively inverts a rising edge of the internal input signal INT_INS and a falling edge of the internal input signal INT_INS based on the first control signal UP and the second control signal DN. An output electrode of the second inversion circuit 120 is coupled to the first node N1. Therefore, the second inversion circuit 120 outputs the inverted signal to the first node N1.

Figure 10:
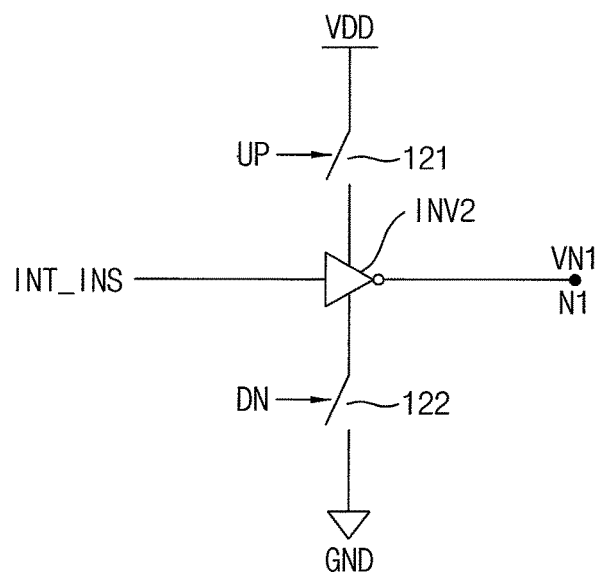
FIG. 10 illustrates a block diagram of an example of a second inversion circuit included in the delay cell of FIG. 9.

FIG. 10 illustrates a block diagram of an example of a second inversion circuit 120 included in the delay cell of FIG. 9.

Referring to FIG. 10, the second inversion circuit 120 includes a second inverter INV2, a first switch 121, and a second switch 122.

The first switch 121 is coupled between a supply voltage VDD and the second inverter INV2. The first switch 121 is turned on in response to the first control signal UP. For example, the first switch 121 may be turned on when the first control signal UP has a first logic level, and turned off when the first control signal UP has a second logic level.

While the first switch 121 is turned on in response to a logic level of the first control signal UP, the second inverter INV2 may invert the falling edge of the internal input signal INT_INS and output the inverted signal to the first node N1. That is, while the first switch 121 is turned on in response to a logic level of the first control signal UP, the second inverter INV2 may transition a signal VN1 of the first node N1 to a logic high level when the internal input signal INT_INS transitions to a logic low level.

On the other hand, while the first switch 121 is turned off in response to a logic level of the first control signal UP, the second inverter INV2 floats the first node N1 when the internal input signal INT_INS transitions to a logic low level.

The second switch 122 is coupled between a ground voltage GND and the second inverter INV2. The second switch 122 is turned on in response to the second control signal DN. For example, the second switch 122 may be turned on when the second control signal DN has the first logic level, and turned off when the second control signal DN has the second logic level.

While the second switch 122 is turned on in response to a logic level of the second control signal DN, the second inverter INV2 may invert the rising edge of the internal input signal INT_INS and output the inverted signal to the first node N1. That is, while the second switch 122 is turned on in response to a logic level of the second control signal DN, the second inverter INV2 may transition the signal VN1 of the first node N1 to a logic low level when the internal input signal INT_INS transitions to a logic high level.

On the other hand, while the second switch 122 is turned off in response to a logic level of the second control signal DN, the second inverter INV2 floats the first node N1 when the internal input signal INT_INS transitions to a logic high level.

Referring again to FIG. 9, the third inversion circuit 130 inverts the signal VN1 of the first node N1. An output electrode of the third inversion circuit 130 is coupled to a second node N2. Therefore, the third inversion circuit 130 outputs the inverted signal to the second node N2. In some example embodiments, the third inversion circuit 130 may include a third inverter INV3.

The fourth inversion circuit 140 selectively inverts a rising edge of the signal VN1 of the first node N1 and a falling edge of the signal VN1 of the first node N1 based on the first control signal UP and the second control signal DN. An output electrode of the fourth inversion circuit 140 is coupled to the second node N2. Therefore, the fourth inversion circuit 140 outputs the inverted signal to the second node N2.

Figure 11:
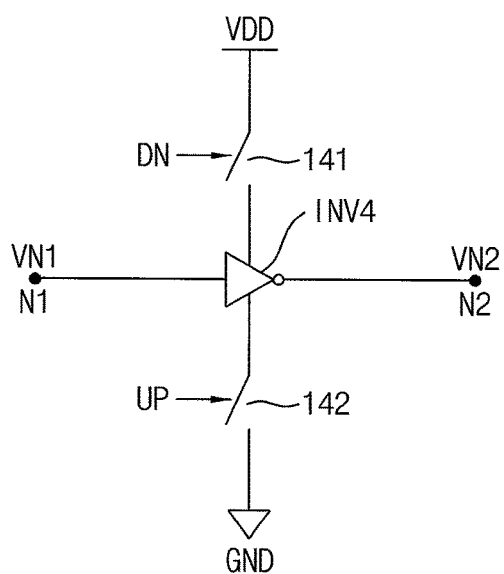
FIG. 11 illustrates a block diagram of an example of a fourth inversion circuit included in the delay cell of FIG. 9.

FIG. 11 illustrates a block diagram of an example of a fourth inversion circuit included in the delay cell of FIG. 9.

Referring to FIG. 11, the fourth inversion circuit 140 includes a fourth inverter INV4, a third switch 141, and a fourth switch 142.

The third switch 141 is coupled between the supply voltage VDD and the fourth inverter INV4. The third switch 141 is turned on in response to the second control signal DN. For example, the third switch 141 may be turned on when the second control signal DN has the first logic level, and turned off when the second control signal DN has the second logic level.

While the third switch 141 is turned on in response to a logic level of the second control signal DN, the fourth inverter INV4 may invert a falling edge of the signal VN1 of the first node N1 and output the inverted signal to the second node N2. That is, while the third switch 141 is turned on in response to a logic level of the second control signal DN, the fourth inverter INV4 may transition a signal VN2 of the second node N2 to a logic high level when the signal VN1 of the first node N1 transitions to a logic low level.

On the other hand, while the third switch 141 is turned off in response to a logic level of the second control signal DN, the fourth inverter INV4 floats the second node N2 when the signal VN1 of the first node N1 transitions to a logic low level.

The fourth switch 142 is coupled between the ground voltage GND and the fourth inverter INV4. The fourth switch 142 is turned on in response to the first control signal UP. For example, the fourth switch 142 may be turned on when the first control signal UP has the first logic level, and turned off when the first control signal UP has the second logic level.

While the fourth switch 142 is turned on in response to a logic level of the first control signal UP, the fourth inverter INV4 may invert a rising edge of the signal VN1 of the first node N1 and output the inverted signal to the second node N2. That is, while the fourth switch 142 is turned on in response to a logic level of the first control signal UP, the fourth inverter INV4 may transition the signal VN2 of the second node N2 to a logic low level when the signal VN1 of the first node N1 transitions to a logic high level.

On the other hand, while the fourth switch 142 is turned off in response to a logic level of the first control signal UP, the fourth inverter INV4 floats the second node N2 when the signal VN1 of the first node N1 transitions to a logic high level.

Referring again to FIG. 9, the fifth inversion circuit 150 inverts the signal VN2 of the second node N2 to generate an internal output signal INT_OUTS. The internal output signal INT_OUTS may be provided to a next delay cell 310 as the internal input signal INT_INS. Although FIG. 9 illustrates that the fifth inversion circuit 150 includes a fifth inverter INV5 and a sixth inverter INV6 coupled in parallel, example embodiments are not limited thereto. According to example embodiments, the fifth inversion circuit 150 may include any number of inverters coupled in parallel.

As described above with reference to FIGS. 9 to 11, the internal output signal INT_OUTS may correspond to an inverted version of the internal input signal INT_INS. In addition, as will be described later, a duty cycle of the internal input signal INT_INS may be adjusted based on the logic level of the first control signal UP and the logic level of the second control signal DN.

Figure 12:
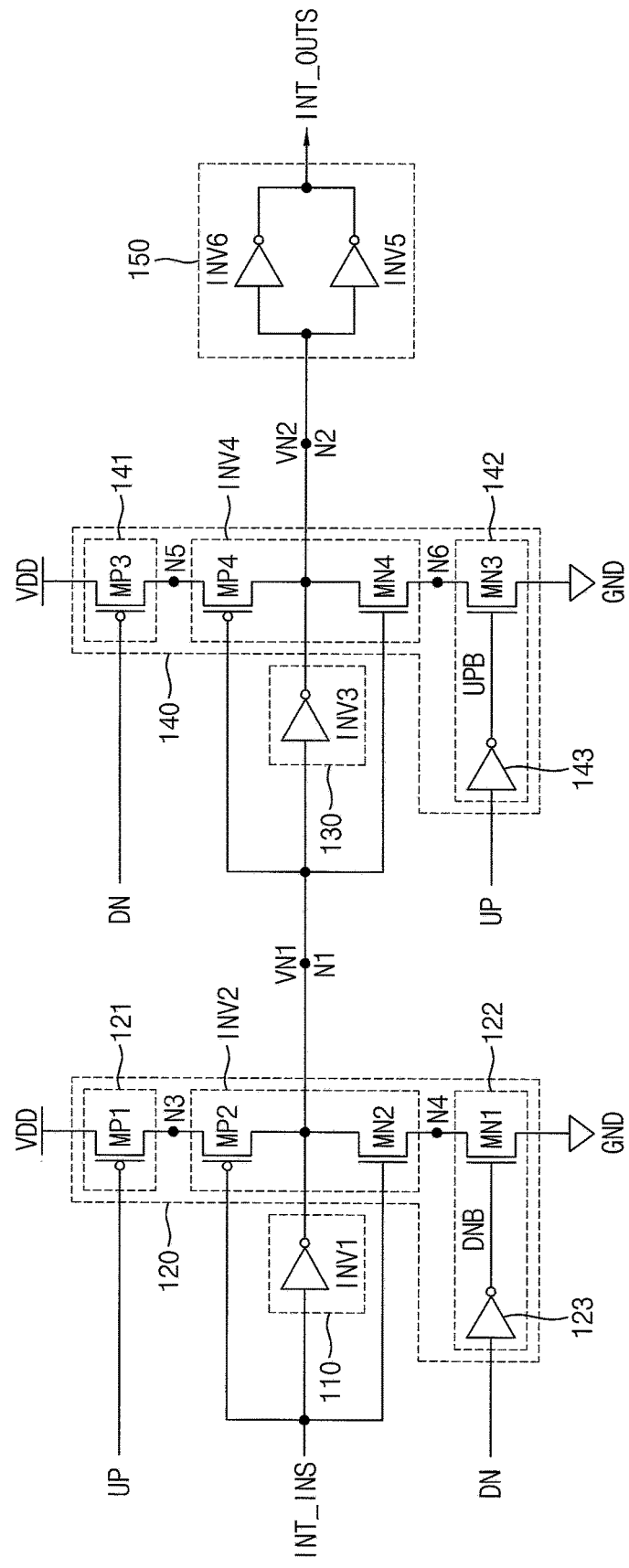
FIG. 12 illustrates a circuit diagram of an example of the delay cell of FIG. 9.

FIG. 12 illustrates a circuit diagram of an example of the delay cell 310 of FIG. 9.

In FIG. 12, a detailed structure of the second inversion circuit 120 of FIG. 10 and a detailed structure of the fourth inversion circuit 140 of FIG. 11 are illustrated.

Referring to FIG. 12, the second inversion circuit 120 includes a first PMOS transistor MP1, a second PMOS transistor MP2, a first NMOS transistor MN1, a second NMOS transistor MN2, and an inverter 123. The fourth inversion circuit 140 includes a third PMOS transistor MP3, a fourth PMOS transistor MP4, a third NMOS transistor MN3, a fourth NMOS transistor MN4, and an inverter 143.

The delay cell 310 of FIG. 12 is the same as the delay cell 100 of FIG. 4, except that in the delay cell 310 of FIG. 12 the first control signal UP is applied to the gate of the first PMOS transistor MP1, the second control signal DN is applied to the gate of the third PMOS transistor MP3, an inverted version DNB of the second control signal DN is applied to the gate of the first NMOS transistor MN1, and an inverted version UPB of the first control signal UP is applied to the gate of the third NMOS transistor MN3, while in the delay cell 100 of FIG. 4 the control signal STR is applied to the gate of the first PMOS transistor MP1 and the gate of the third PMOS transistor MP3, and the inverted control signal STRB is applied to the gate of the first NMOS transistor MN1 and the gate of the third NMOS transistor MN3. Therefore, detailed descriptions about the structure of the delay circuit 310 of FIG. 12 that is the same as the delay circuit 100 of FIG. 4 will be omitted from the following.

FIGS. 13, 14, 15 and 16 illustrate diagrams for describing an operation of the delay cell of FIG. 12.

Figure 13:
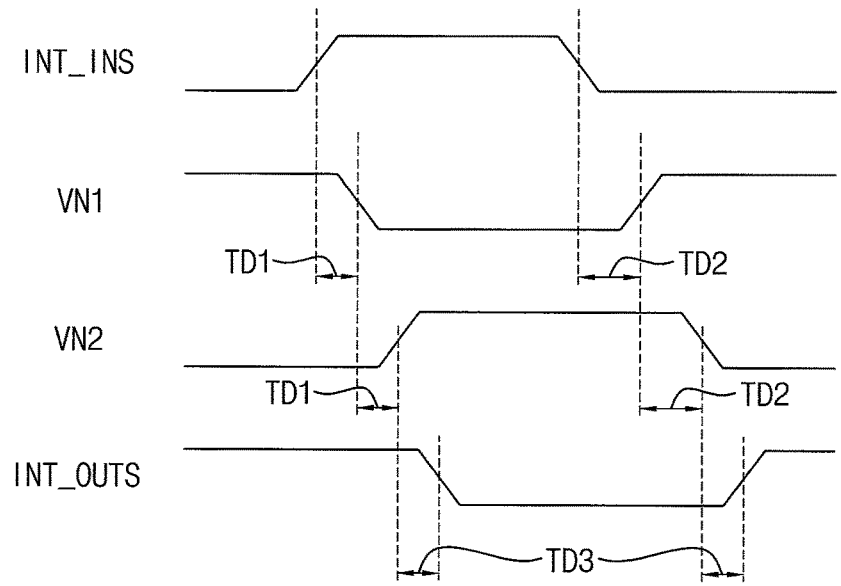
FIGS. 13, 14, 15 and 16 illustrate diagrams for describing an operation of the delay cell of FIG. 12.

FIG. 13 represents an operation of the delay cell 310 when the first control signal UP has a logic high level and the second control signal DN has a logic low level.

Referring to FIGS. 12 and 13, when the internal input signal INT_INS transitions to a logic high level, the signal VN1 of the first node N1 may transition to a logic low level after a first delay time TD1 by operation of the first inverter INV1 and the second inverter INV2.

When the signal VN1 of the first node N1 transitions to a logic low level, the signal VN2 of the second node N2 may transition to a logic high level after the first delay time TD1 by operation of the third inverter INV3 and the fourth inverter INV4.

When the signal VN2 of the second node N2 transitions to a logic high level, the internal output signal INT_OUTS may transition to a logic low level after a third delay time TD3 by operation of the fifth inversion circuit 150.

After that, when the internal input signal INT_INS transitions to a logic low level, the signal VN1 of the first node N1 may transition to a logic high level after a second delay time TD2, which is longer than the first delay time TD1, by operation of only the first inverter INV1 since the second inverter INV2 is turned off.

When the signal VN1 of the first node N1 transitions to a logic high level, the signal VN2 of the second node N2 may transition to a logic low level after the second delay time TD2 by operation of only the third inverter INV3 since the fourth inverter INV4 is turned off.

When the signal VN2 of the second node N2 transitions to a logic low level, the internal output signal INT_OUTS may transition to a logic high level after the third delay time TD3 by operation of the fifth inversion circuit 150.

Therefore, as illustrated in FIG. 13, when the first control signal UP has a logic high level and the second control signal DN has a logic low level, the delay cell 310 adjusts the duty cycle of the internal input signal INT_INS by increasing a high level period of the internal input signal INT_INS.

Figure 14:
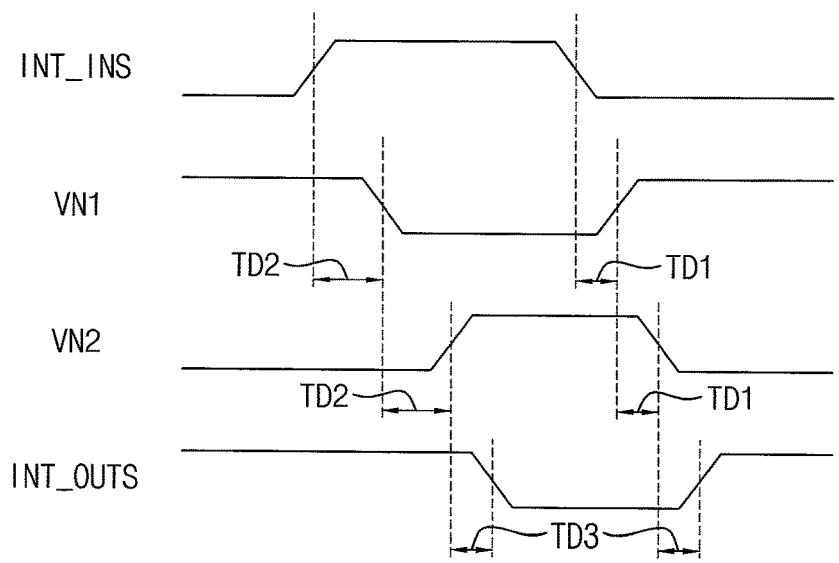

FIG. 14 represents an operation of the delay cell 310 when the first control signal UP has a logic low level and the second control signal DN has a logic high level.

Referring to FIGS. 12 and 14, when the internal input signal INT_INS transitions to a logic high level, the signal VN1 of the first node N1 may transition to a logic low level after the second delay time TD2 by operation of only the first inverter INV1 since the second inverter INV2 is turned off.

When the signal VN1 of the first node N1 transitions to a logic low level, the signal VN2 of the second node N2 may transition to a logic high level after the second delay time TD2 by operation of only the third inverter INV3 since the fourth inverter INV4 is turned off.

When the signal VN2 of the second node N2 transitions to a logic high level, the internal output signal INT_OUTS may transition to a logic low level after the third delay time TD3 by operation of the fifth inversion circuit 150.

After that, when the internal input signal INT_INS transitions to a logic low level, the signal VN1 of the first node N1 may transition to a logic high level after the first delay time TD1, which is shorter than the second delay time TD2, by operation of the first inverter INV1 and the second inverter INV2.

When the signal VN1 of the first node N1 transitions to a logic high level, the signal VN2 of the second node N2 may transition to a logic low level after the first delay time TD1 by operation of the third inverter INV3 and the fourth inverter INV4.

When the signal VN2 of the second node N2 transitions to a logic low level, the internal output signal INT_OUTS may transition to a logic high level after the third delay time TD3 by operation of the fifth inversion circuit 150.

Therefore, as illustrated in FIG. 14, when the first control signal UP has a logic low level and the second control signal DN has a logic high level, the delay cell 310 adjusts the duty cycle of the internal input signal INT_INS by decreasing a high level period of the internal input signal INT_INS.

Figure 15:
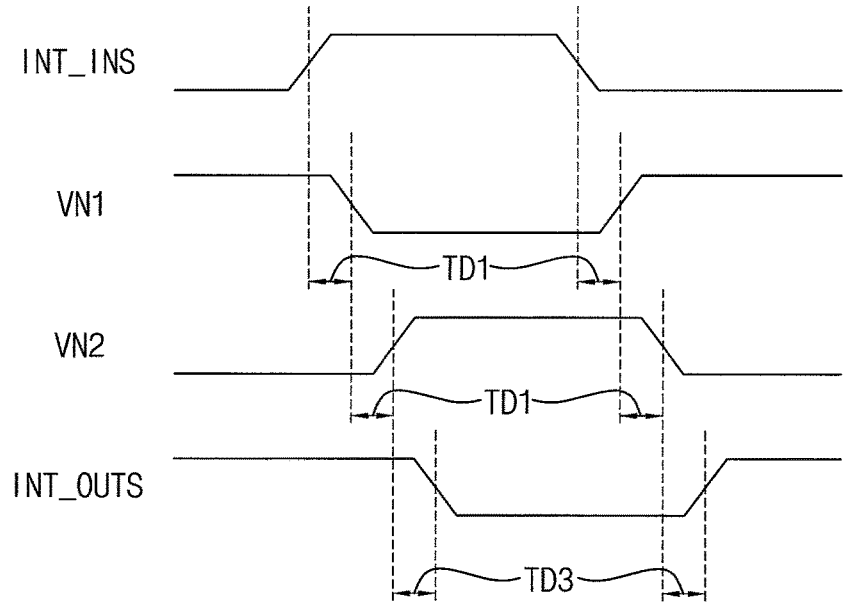

FIG. 15 represents an operation of the delay cell 310 when the first control signal UP has a logic low level and the second control signal DN has a logic low level.

Referring to FIGS. 12 and 15, when the internal input signal INT_INS transitions to a logic high level, the signal VN1 of the first node N1 may transition to a logic low level after the first delay time TD1 by operation of the first inverter INV1 and the second inverter INV2.

When the signal VN1 of the first node N1 transitions to a logic low level, the signal VN2 of the second node N2 may transition to a logic high level after the first delay time TD1 by operation of the third inverter INV3 and the fourth inverter INV4.

When the signal VN2 of the second node N2 transitions to a logic high level, the internal output signal INT_OUTS may transition to a logic low level after the third delay time TD3 by operation of the fifth inversion circuit 150.

After that, when the internal input signal INT_INS transitions to a logic low level, the signal VN1 of the first node N1 may transition to a logic high level after the first delay time TD1 by operation of the first inverter INV1 and the second inverter INV2.

When the signal VN1 of the first node N1 transitions to a logic high level, the signal VN2 of the second node N2 may transition to a logic low level after the first delay time TD1 by operation of the third inverter INV3 and the fourth inverter INV4.

When the signal VN2 of the second node N2 transitions to a logic low level, the internal output signal INT_OUTS may transition to a logic high level after the third delay time TD3 by operation of the fifth inversion circuit 150.

Therefore, as illustrated in FIG. 15, when the first control signal UP has a logic low level and the second control signal DN has a logic low level, the delay cell 310 outputs the internal output signal INT_OUTS, which corresponds to an inverted version of the internal input signal INT_INS, after a delay time of (2*TD1+TD3) without adjusting the duty cycle of the internal input signal INT_INS.

Figure 16:
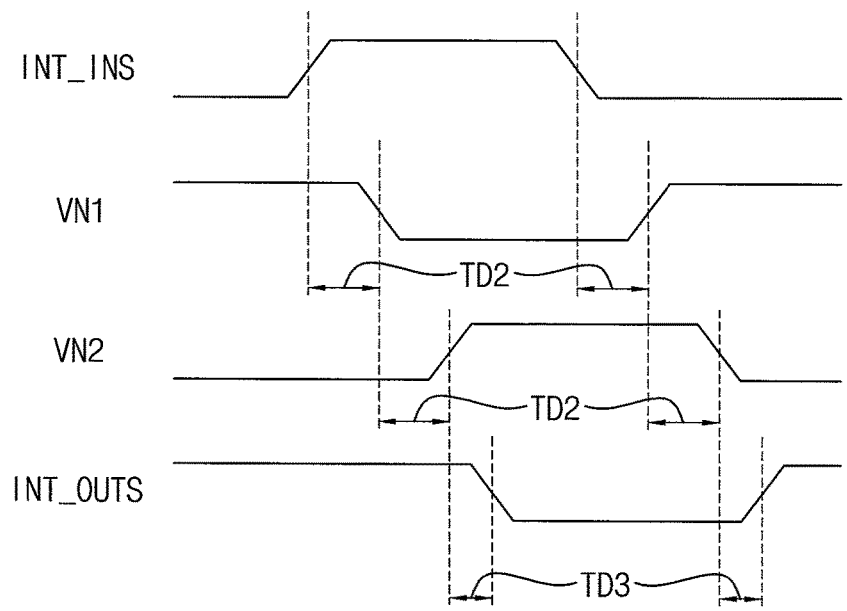

FIG. 16 represents an operation of the delay cell 310 when the first control signal UP has a logic high level and the second control signal DN has a logic high level.

Referring to FIGS. 12 and 16, when the internal input signal INT_INS transitions to a logic high level, the signal VN1 of the first node N1 may transition to a logic low level after the second delay time TD2, which is longer than the first delay time TD1, by operation of only the first inverter INV1 since the second inverter INV2 is turned off.

When the signal VN1 of the first node N1 transitions to a logic low level, the signal VN2 of the second node N2 may transition to a logic high level after the second delay time TD2 by operation of only the third inverter INV3 since the fourth inverter INV4 is turned off.

When the signal VN2 of the second node N2 transitions to a logic high level, the internal output signal INT_OUTS may transition to a logic low level after the third delay time TD3 by operation of the fifth inversion circuit 150.

After that, when the internal input signal INT_INS transitions to a logic low level, the signal VN1 of the first node N1 may transition to a logic high level after the second delay time TD2 by operation of only the first inverter INV1 since the second inverter INV2 is turned off.

When the signal VN1 of the first node N1 transitions to a logic high level, the signal VN2 of the second node N2 may transition to a logic low level after the second delay time TD2 by operation of only the third inverter INV3 since the fourth inverter INV4 is turned off.

When the signal VN2 of the second node N2 transitions to a logic low level, the internal output signal INT_OUTS may transition to a logic high level after the third delay time TD3 by operation of the fifth inversion circuit 150.

Therefore, as illustrated in FIG. 16, when the first control signal UP has a logic high level and the second control signal DN has a logic high level, the delay cell 310 outputs the internal output signal INT_OUTS, which corresponds to an inverted version of the internal input signal INT_INS, after a delay time of (2*TD2+TD3) without adjusting the duty cycle of the internal input signal INT_INS.

As described above with reference to FIGS. 9 to 16, the delay cell 310 of FIG. 9 may adjust the duty cycle of the internal input signal INT_INS based on the logic level of the first control signal UP and the logic level of the second control signal DN, and output the internal output signal INT_OUTS, which corresponds to an inverted version of the internal input signal INT_INS.

Therefore, the duty cycle adjust circuit 300 included in the delay line 200 of FIG. 8 may adjust the duty cycle of the input signal INS based on the logic level of the first control signal UP[3:1] and the logic level of the second control signal DN[3:1]. As the number of the at least one delay cells 310-1, 310-2, and 310-3 included in the duty cycle adjust circuit 300 increases, a range of the duty cycle of the input signal INS adjustable by the duty cycle adjust circuit 300 may increase.

In addition, as described above, since the duty cycle adjust circuit 300 includes an odd number of delay cells 310-1, 310-2, and 310-3, the first internal signal INTS1 output by the duty cycle adjust circuit 300 may correspond to an inverted version of the input signal INS.

Referring again to FIG. 8, the fine delay circuit 400 included in the delay line 200 includes a plurality of delay cells DC 410-1, 410-2, and 410-3 coupled in series. The plurality of delay cells 410-1, 410-2, and 410-3 operate based on the third control signal STR[3:1].

The number of bits included in the third control signal STR[3:1] is the same as the number of the plurality of delay cells 410-1, 410-2, and 410-3 included in the fine delay circuit 400. Each of the plurality of delay cells 410-1, 410-2, and 410-3 included in the fine delay circuit 400 receives a respective bit of the third control signal STR[3:1]. For example, the delay cell 410-1 receives a first bit STR[1] of the third control signal STR[3:1], the delay cell 410-2 receives a second bit STR[2] of the third control signal STR[3:1], and the delay cell 410-3 receives a third bit STR[3] of the third control signal STR[3:1].

In some example embodiments, the number of the plurality of delay cells 410-1, 410-2, and 410-3 included in the fine delay circuit 400 may correspond to an odd number. In FIG. 8, the fine delay circuit 400 is illustrated as including three delay cells 410-1, 410-2, and 410-3 as an example. However, example embodiments are not limited thereto. For example, in some embodiments of the inventive concept, the fine delay circuit 400 may include more delay cells coupled in series than the three delay cells 410-1, 410-2, and 410-3.

Each of the plurality of delay cells 410-1, 410-2, and 410-3 included in the fine delay circuit 400 may adjust a delay time of a received signal without changing a duty cycle of the received signal by equally adjusting a delay time of a rising edge of the received signal and a delay time of a falling edge of the received signal based on the third control signal STR[3:1].

Each of the plurality of delay cells 410-1, 410-2, and 410-3 included in the fine delay circuit 400 may be the same as the delay cell 100 of FIG. 1. As described above with reference to FIGS. 1 to 6, a delay time of the delay cell 100 may decrease when the control signal STR has a logic low level, and the delay time of the delay cell 100 may increase when the control signal STR has a logic high level.

Therefore, as the number of bits having a logic high level "1" included in the third control signal STR[3:1] increases, the fine delay circuit 400 increases a delay time of the first internal signal INTS1. Alternately, as the number of bits having a logic high level "1" included in the third control signal STR[3:1] decreases, the fine delay circuit 400 decreases a delay time of the first internal signal INTS1.

FIGS. 17, 18, 19 and 20 illustrate diagrams for describing an operation of a fine delay circuit of FIG. 8.

FIGS. 17 to 20 represent an example of an operation of the fine delay circuit 400 in the case where the fine delay circuit 400 includes three delay cells 410-1, 410-2, and 410-3.

As described above with reference to FIG. 5, when the control signal STR has a logic low level, the delay time of the delay cell 100 corresponds to (2*TD1+TD3). In addition, as described above with reference to FIG. 6, when the control signal STR has a logic high level, the delay time of the delay cell 100 corresponds to (2*TD2+TD3) which is greater than the delay time (2*TD1+TD3).

Hereinafter, a delay time of (2*TD1+TD3) is referred to as a fourth delay time TD4, and a delay time of (2*TD2+TD3) is referred to as a fifth delay time TD5.

Figure 17:
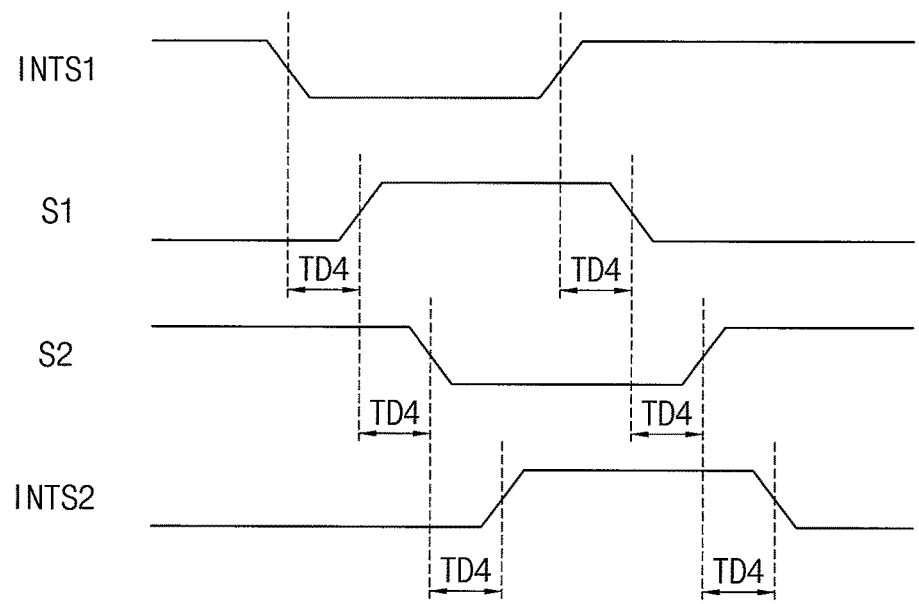
FIGS. 17, 18, 19 and 20 illustrate diagrams for describing an operation of a fine delay circuit of FIG. 8.

FIG. 17 represents an operation of the fine delay circuit 400 when the third control signal STR[3:1] is "000".

As illustrated in FIG. 17, the first delay cell 410-1 delays the first internal signal INTS1 as provided by duty cycle adjust circuit 300 shown in FIG. 8 by the fourth delay time TD4 and inverts the first internal signal INTS1 to generate a first signal S1. The second delay cell 410-2 delays the first signal S1 by the fourth delay time TD4 and inverts the first signal S1 to generate a second signal S2. The third delay cell 410-3 delays the second signal S2 by the fourth delay time TD4 and inverts the second signal S2 to generate the second internal signal INTS2.

Therefore, when the third control signal STR[3:1] is "000", a delay time of the fine delay circuit 400 corresponds to (3*TD4).

Figure 18:
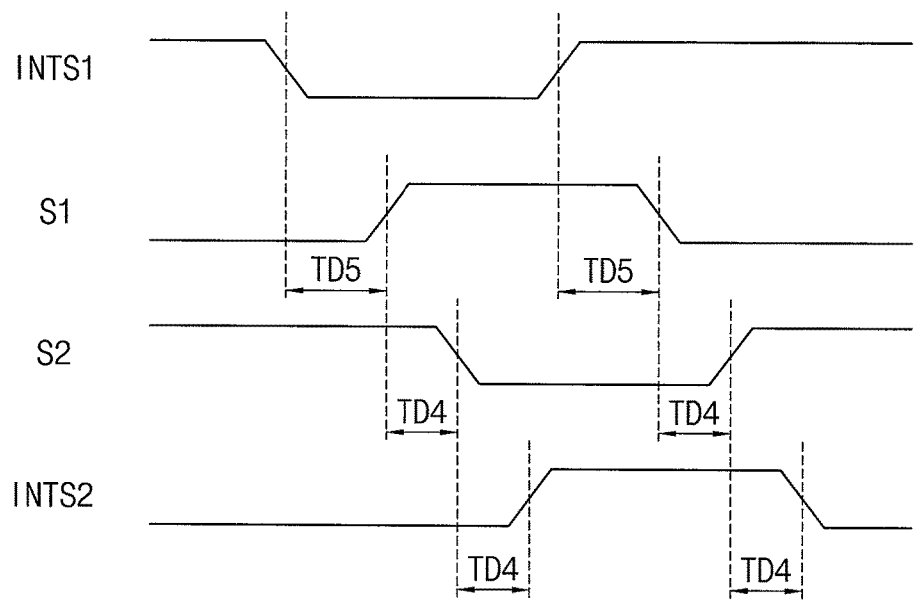

FIG. 18 represents an operation of the fine delay circuit 400 when the third control signal STR[3:1] is "001".

As illustrated in FIG. 18, the first delay cell 410-1 delays the first internal signal INTS1 by the fifth delay time TD5, which is longer than the fourth delay time TD4, and inverts the first internal signal INTS1 to generate the first signal S1. The second delay cell 410-2 delays the first signal S1 by the fourth delay time TD4 and inverts the first signal S1 to generate the second signal S2. The third delay cell 410-3 delays the second signal S2 by the fourth delay time TD4 and inverts the second signal S2 to generate the second internal signal INTS2.

Therefore, when the third control signal STR[3:1] is "001", the delay time of the fine delay circuit 400 corresponds to (2*TD4+TD5).

Figure 19:
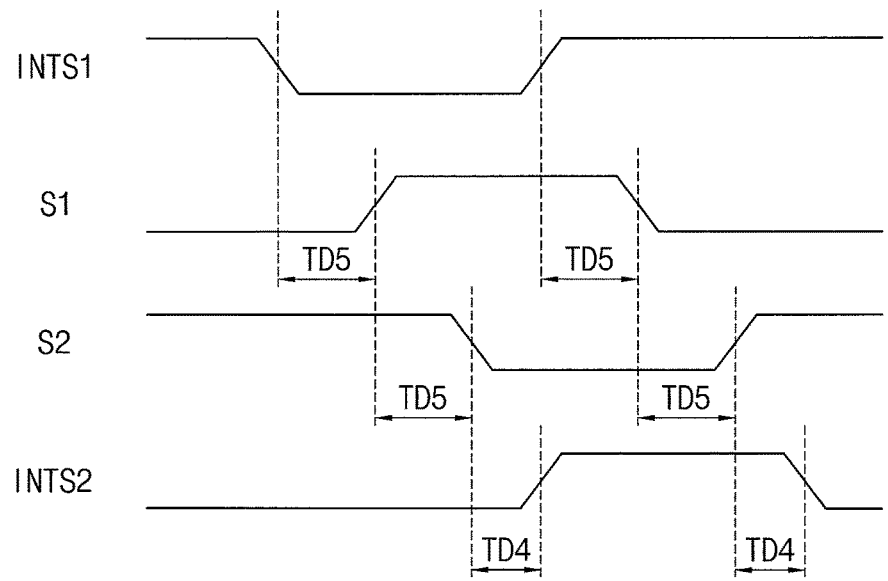

FIG. 19 represents an operation of the fine delay circuit 400 when the third control signal STR[3:1] is "011".

As illustrated in FIG. 19, the first delay cell 410-1 delays the first internal signal INTS1 by the fifth delay time TD5, which is longer than the fourth delay time TD4, and inverts the first internal signal INTS1 to generate the first signal S1. The second delay cell 410-2 delays the first signal S1 by the fifth delay time TD5 and inverts the first signal S1 to generate the second signal S2. The third delay cell 410-3 delays the second signal S2 by the fourth delay time TD4 and inverts the second signal S2 to generate the second internal signal INTS2.

Therefore, when the third control signal STR[3:1] is "011", the delay time of the fine delay circuit 400 corresponds to (TD4+2*TD5).

Figure 20:
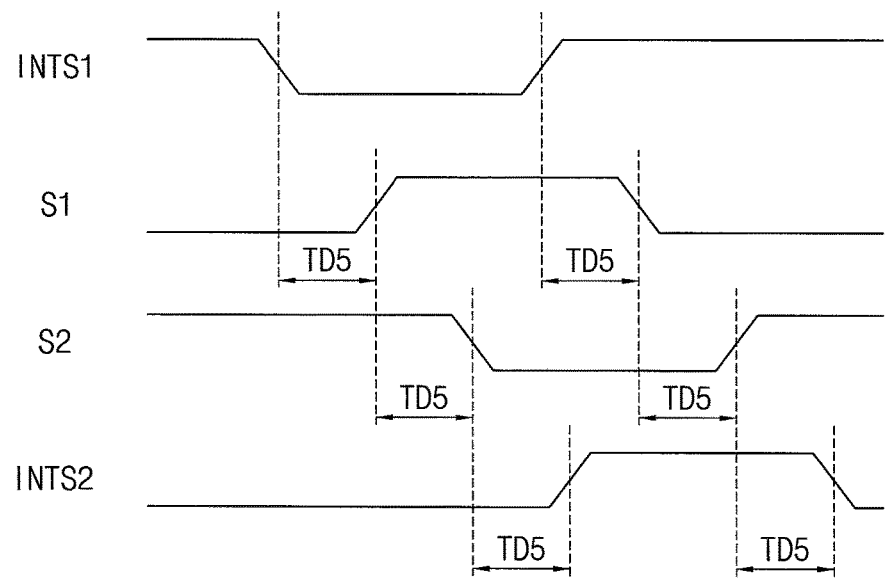

FIG. 20 represents an operation of the fine delay circuit 400 when the third control signal STR[3:1] is "111".

As illustrated in FIG. 20, the first delay cell 410-1 delays the first internal signal INTS1 by the fifth delay time TD5, which is longer than the fourth delay time TD4, and inverts the first internal signal INTS1 to generate the first signal S1. The second delay cell 410-2 delays the first signal S1 by the fifth delay time TD5 and inverts the first signal S1 to generate the second signal S2. The third delay cell 410-3 delay the second signal S2 by the fifth delay time TD5 and inverts the second signal S2 to generate the second internal signal INTS2.

Therefore, when the third control signal STR[3:1] is "111", the delay time of the fine delay circuit 400 corresponds to (3*TD5).

As described above with reference to FIGS. 17 to 20, the fine delay circuit 400 adjusts the delay time of the first internal signal INTS1 by units of a first unit delay UD1, which corresponds to a difference between the fifth delay time TD5 and the fourth delay time TD4, based on the third control signal STR[3:1].

In addition, as described above with reference to FIGS. 8-20, the duty cycle adjust circuit 300 and the fine delay circuit 400 are implemented using respective delay cells 100 of FIG. 1. That is, each of the at least one delay cells 310-1, 310-2, and 310-3 included in the duty cycle adjust circuit 300 and each of the plurality of delay cells 410-1, 410-2, and 410-3 included in the fine delay circuit 400 are implemented using the delay cells 100 of FIG. 1, which operate differently based on provided control signals.

Therefore, the delay line 200 according to example embodiments of the inventive concept corrects the duty cycle of the input signal INS using the duty cycle adjust circuit 300, which is implemented with delay cells that are the same as that delay cells included in the fine delay circuit 400, without using a separate duty cycle correction device. As such, the delay line 200 may be implemented in a relatively small size.

Figure 21:
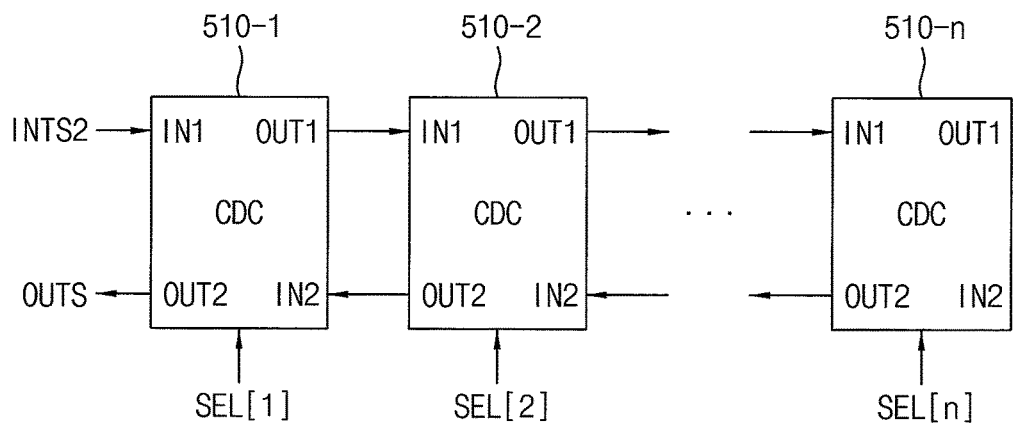
FIG. 21 illustrates a block diagram of an example of a coarse delay circuit included in the delay line of FIG. 7.

FIG. 21 illustrates a block diagram of an example of a coarse delay circuit included in the delay line of FIG. 7.

Referring to FIG. 21, the coarse delay circuit 500 includes a plurality of coarse delay cells CDC 510-1, 510-2, . . . , 510-n. Here, n represents a positive integer.

Each of the plurality of coarse delay cells 510-1, 510-2, . . . , 510-n receives a respective bit of the fourth control signal SEL. The fourth control signal SEL may have a plurality of bits, and may be characterized hereinafter as fourth control signal SEL[n:1]. For example, as shown in FIG. 22, the coarse delay cell 510-1 receives a first bit SE[1] of the fourth control signal SEL[n:1], the coarse delay cell 510-2 receives a second bit SEL[2] of the fourth control signal SEL[n:1], and the coarse delay cell 510-n receives an n-th bit SEL[n] of the fourth control signal SEL[n:1].

Each of the plurality of coarse delay cells 510-1, 510-2, . . . , 510-n receive a signal at a corresponding first input electrode IN1 and output the received signal at a corresponding first output electrode OUT1, and receive another signal at a corresponding second input electrode IN2 and output the another received signal at a corresponding second output electrode OUT2, based on the fourth control signal SEL[n:1]. Alternately, each of the plurality of coarse delay cells 510-1, 510-2, . . . , 510-n may output a signal which is received at a corresponding first input electrode IN1 through a corresponding second output electrode OUT2.

Figure 22:
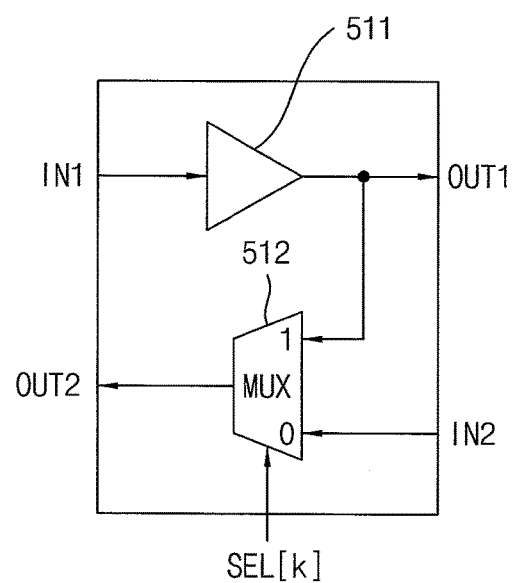
FIG. 22 illustrates a circuit diagram of an example of a coarse delay cell included in the coarse delay circuit of FIG. 21.

FIG. 22 illustrates a circuit diagram of an example of a coarse delay cell included in the coarse delay circuit of FIG. 21.

Each of the plurality of coarse delay cells 510-1, 510-2, . . . , 510-n included in the coarse delay circuit 500 of FIG. 21 may be implemented with a coarse delay cell 510 of FIG. 22.

Referring to FIG. 22, the coarse delay cell 510 includes a buffer 511 and a multiplexer MUX 512.

As illustrated in FIG. 22, when the fourth control signal SEL[k] is "0", the buffer 511 outputs a signal which is received at the first input electrode IN1 through the first output electrode OUT1, and the multiplexer 512 outputs a signal which is received at the second input electrode IN2 through the second output electrode OUT2. Here, k represents a positive integer equal to or smaller than n.

Alternately, when the fourth control signal SEL[k] is "1", the buffer 511 provides a signal which is received at the first input electrode IN1 to the multiplexer 512, and the multiplexer 512 outputs the signal which is received from the buffer 511 through the second output electrode OUT2.

Therefore, the coarse delay cell 510 receiving the fourth control signal SEL[k] of "0" may transfer a signal received at the first input electrode IN1 to a next coarse delay cell 510 through the first output electrode OUT1, and the coarse delay cell 510 receiving the fourth control signal SEL[k] of "1" may return a signal received at the first input electrode IN1 to a previous coarse delay cell 510 through the second output electrode OUT2.

In some example embodiments, only one bit in the fourth control signal SEL[n:1] may be "1" and the rest of bits in the fourth control signal SEL[n:1] may be "0". In such a case, the coarse delay circuit 500 may delay the second internal signal INTS2 by a delay time determined based on a location of the bit "1" in the fourth control signal SEL[n:1], and output the delayed signal as the output signal OUTS.

The delay time of the coarse delay circuit 500 may be referred to as a second unit delay UD2. The coarse delay circuit 500 may adjust the delay time of the second internal signal INTS2 by units of the second unit delay UD2 based on the fourth control signal SEL[n:1].

The first unit delay UD1 of the fine delay circuit 400 may be shorter than the second unit delay UD2 of the coarse delay circuit 500. Therefore, the delay line 200 may coarsely adjust the delay time of the input signal INS based on the fourth control signal SEL, and finely adjust the delay time of the input signal INS based on the third control signal STR.

In some example embodiments, when the number of the plurality of delay cells 410 included in the fine delay circuit 400 is P and the second unit delay UD2 of the coarse delay circuit 500 is D, the first unit delay UD1 of the fine delay circuit 400 may correspond to D/(P+1).

Figure 23:
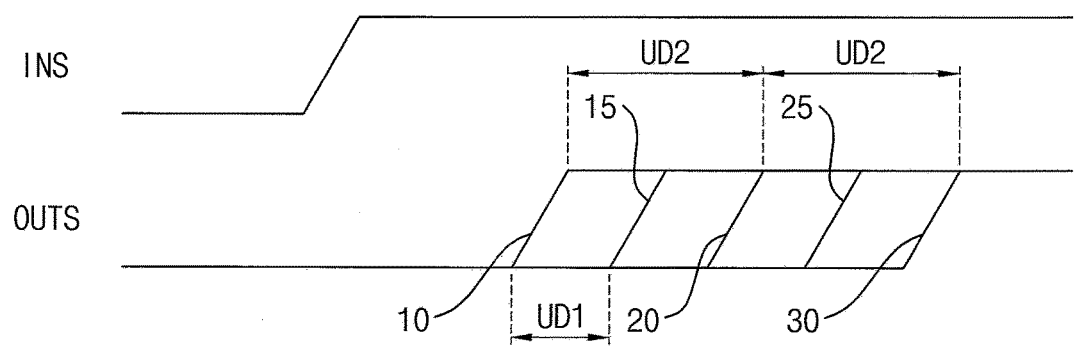
FIGS. 23 and 24 illustrate diagrams for describing an operation of the delay line of FIG. 7.
Figure 24:
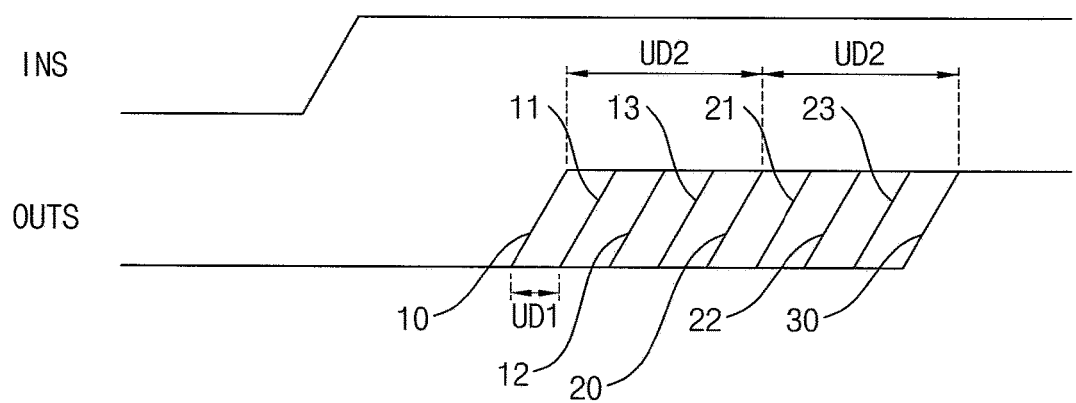

FIGS. 23 and 24 illustrate diagrams for describing an operation of the delay line of FIG. 7.

FIG. 23 represents an operation of the delay line 200 when the fine delay circuit 400 includes one delay cell 410 and the coarse delay circuit 500 includes three coarse delay cells 510.

As described above, when the number of the plurality of delay cells 410 included in the fine delay circuit 400 is P and the second unit delay UD2 of the coarse delay circuit 500 is D, the first unit delay UD1 of the fine delay circuit 400 may correspond to D/(P+1). Therefore, in the case of FIG. 23, the first unit delay UD1 of the fine delay circuit 400 may correspond to a half of the second unit delay UD2.

Therefore, as illustrated in FIG. 23, the output signal OUTS output by the delay line 200 may correspond to a graph 10 when the third control signal STR is "0" and the fourth control signal SEL is "001", and the output signal OUTS output by the delay line 200 may correspond to a graph 15 when the third control signal STR is "1" and the fourth control signal SEL is "001". Similarly, the output signal OUTS output by the delay line 200 may correspond to a graph 20 when the third control signal STR is "0" and the fourth control signal SEL is "010", and the output signal OUTS output by the delay line 200 may correspond to a graph 25 when the third control signal STR is "1" and the fourth control signal SEL is "010". Similarly, the output signal OUTS output by the delay line 200 may correspond to a graph 30 when the third control signal STR is "0" and the fourth control signal SEL is "100".

FIG. 24 represents an operation of the delay line 200 when the fine delay circuit 400 includes three delay cells 410 and the coarse delay circuit 500 includes three coarse delay cells 510.

As described above, when the number of the plurality of delay cells 410 included in the fine delay circuit 400 is P and the second unit delay UD2 of the coarse delay circuit 500 is D, the first unit delay UD1 of the fine delay circuit 400 may correspond to D/(P+1). Therefore, in the case of FIG. 24, the first unit delay UD1 of the fine delay circuit 400 may correspond to a quarter of the second unit delay UD2.

Therefore, as illustrated in FIG. 24, the output signal OUTS output by the delay line 200 may correspond to a graph 10 when the third control signal STR is "000" and the fourth control signal SEL is "001", the output signal OUTS output by the delay line 200 may correspond to a graph 11 when the third control signal STR is "001" and the fourth control signal SEL is "001", the output signal OUTS output by the delay line 200 may correspond to a graph 12 when the third control signal STR is "011" and the fourth control signal SEL is "001", and the output signal OUTS output by the delay line 200 may correspond to a graph 13 when the third control signal STR is "111" and the fourth control signal SEL is "001".

Similarly, the output signal OUTS output by the delay line 200 may correspond to a graph 20 when the third control signal STR is "000" and the fourth control signal SEL is "010", the output signal OUTS output by the delay line 200 may correspond to a graph 21 when the third control signal STR is "001" and the fourth control signal SEL is "010", the output signal OUTS output by the delay line 200 may correspond to a graph 22 when the third control signal STR is "011" and the fourth control signal SEL is "010", and the output signal OUTS output by the delay line 200 may correspond to a graph 23 when the third control signal STR is "111" and the fourth control signal SEL is "010".

Similarly, the output signal OUTS output by the delay line 200 may correspond to a graph 30 when the third control signal STR is "000" and the fourth control signal SEL is "100".

As described above with reference to FIGS. 1 to 24, the delay line 200 according to example embodiments of the inventive concept may correct the duty cycle of the input signal INS using the duty cycle adjust circuit 300 which is implemented using a delay cell that is the same as a delay cell included in the fine delay circuit 400, without a separate duty cycle correction device. As such, the delay line 200 may correct the duty cycle of the input signal INS and finely control the delay time of the input signal INS, while the delay line 200 is implemented in a relatively small size.

Figure 25:
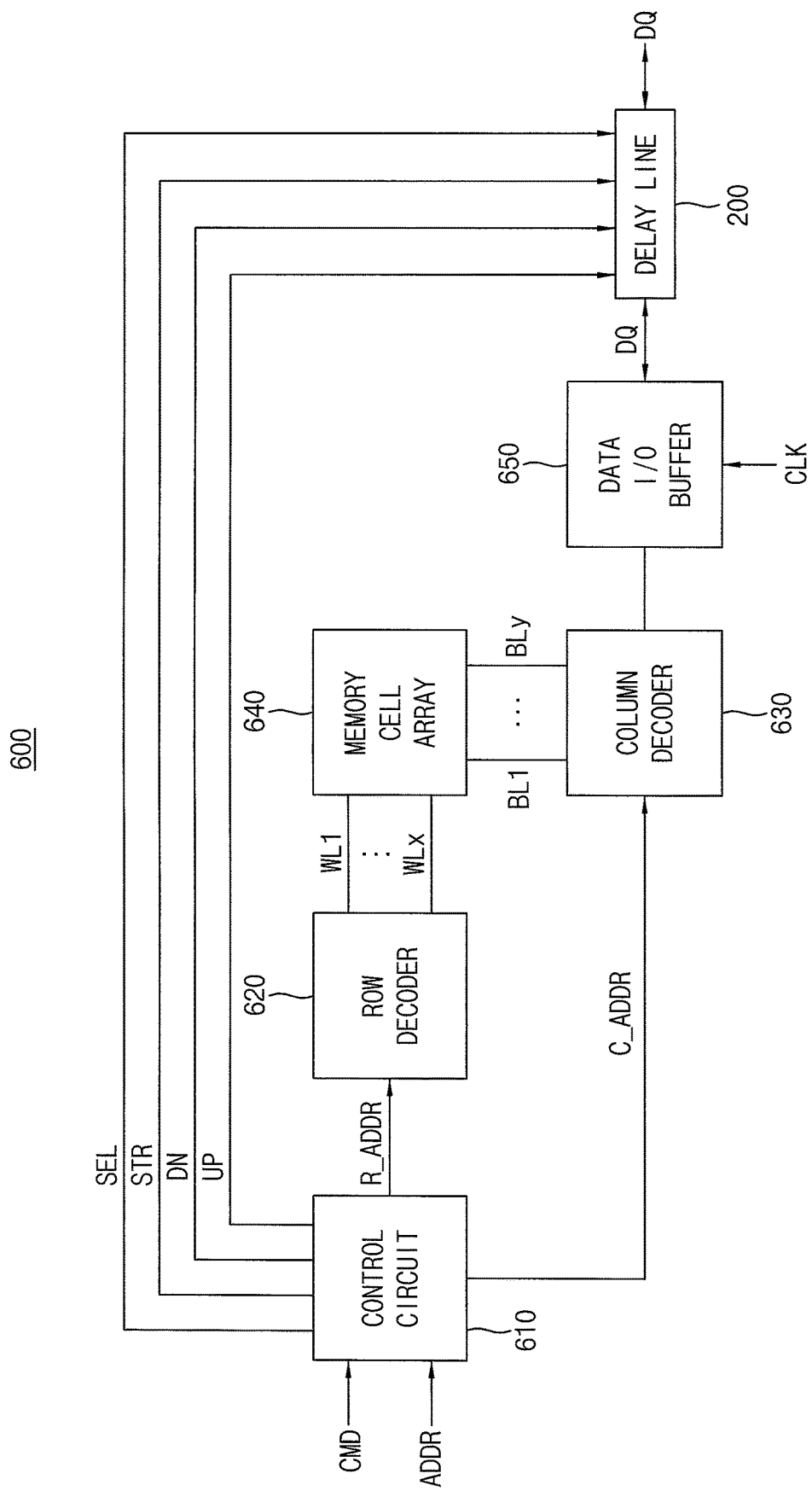
FIG. 25 illustrates a block diagram of a memory device according to example embodiments of the inventive concept.

FIG. 25 illustrates a block diagram of a memory device according to example embodiments of the inventive concept.

Referring to FIG. 25, a memory device 600 includes a control circuit 610, a row decoder 620, a column decoder 630, a memory cell array 640, a data input/output buffer 650, and a delay line 200.

The memory cell array 640 may include a plurality of memory cells arranged in rows and columns The row decoder 620 is coupled to the plurality of memory cells included in the memory cell array 640 through a plurality of word lines WL1~WLx. For example, a first word line WL1 may be coupled to memory cells arranged in a first row, and an X-th word line WLx may be coupled to memory cells arranged in an x-th row. Here, x represents a positive integer.

The column decoder 630 is coupled to the plurality of memory cells included in the memory cell array 640 through a plurality of bit lines BL1~BLy. For example, a first bit line BL1 may be coupled to memory cells arranged in a first column, and a y-th bit line BLy may be coupled to memory cells arranged in a y-th column. Here, y represents a positive integer.

The control circuit 610 controls overall operations of the memory device 600. For example, the control circuit 610 may decode a command signal CMD received from an external memory controller to control the memory device 600 to perform a write operation or a read operation. In addition, the control circuit 610 may decode an address signal ADDR received from the external memory controller to generate a row address R_ADDR and a column address C_ADDR. The control circuit 610 provides the row address R_ADDR to the row decoder 620, and provides the column address C_ADDR to the column decoder 630.

In addition, the control circuit 610 may provide a first control signal UP, a second control signal DN, a third control signal STR, and a fourth control signal SEL to the delay line 200.

The row decoder 620 may activate one of the plurality of word lines WL1~WLx corresponding to the row address R_ADDR.

In a write mode, the data input/output buffer 650 may store data DQ received from the external memory controller through the delay line 200, and provide the data DQ to the column decoder 630. The column decoder 630 may write the data DQ, which is received from the data input/output buffer 650, in a memory cell coupled to one of the plurality of bit lines BL1~BLy that corresponds to the column address C_ADDR.

In a read mode, the column decoder 630 may provide data DQ, which is received through one of the plurality of bit lines BL1~BLy that corresponds to the column address C_ADDR, to the data input/output buffer 650. The data input/output buffer 650 may store the data DQ received from the column decoder 630, and output the data DQ in synchronization with a clock signal CLK. The delay line 200 may output the data DQ to the external memory controller after adjusting a duty cycle of the data DQ based on the first control signal UP and the second control signal DN, and adjusting a delay time of the data DQ based on the third control signal STR and the fourth control signal SEL.

The delay line 200 included in the memory device 600 of FIG. 25 may be implemented with the delay line 200 of FIG. 7. The structure and the operation of the delay line 200 of FIG. 7 are described above with reference to FIGS. 1 to 24. Therefore, detailed descriptions about the delay line 200 included in the memory device 600 of FIG. 25 are here omitted.

In some example embodiments of the inventive concept, values of the first control signal UP, the second control signal DN, the third control signal STR, and the fourth control signal SEL may be determined during a test process of the memory device 600, such that a phase difference between the data DQ output by the delay line 200 and the clock signal CLK may become a desired phase difference. The determined values of the first control signal UP, the second control signal DN, the third control signal STR, and the fourth control signal SEL may be prestored in an internal register of the control circuit 610.

In some example embodiments, the control circuit 610 may detect a change of the clock signal CLK according to temperature and adjust the values of the first control signal UP, the second control signal DN, the third control signal STR, and the fourth control signal SEL in response to a change of the clock signal CLK.

As described above, since the memory device 600 includes the delay line 200 of FIG. 7, the memory device 600 may correct a duty cycle error of the data DQ and finely control a delay time of the data DQ. Therefore, a synchronization error between the memory device 600 and the external memory controller may be effectively decreased.

Figure 26:
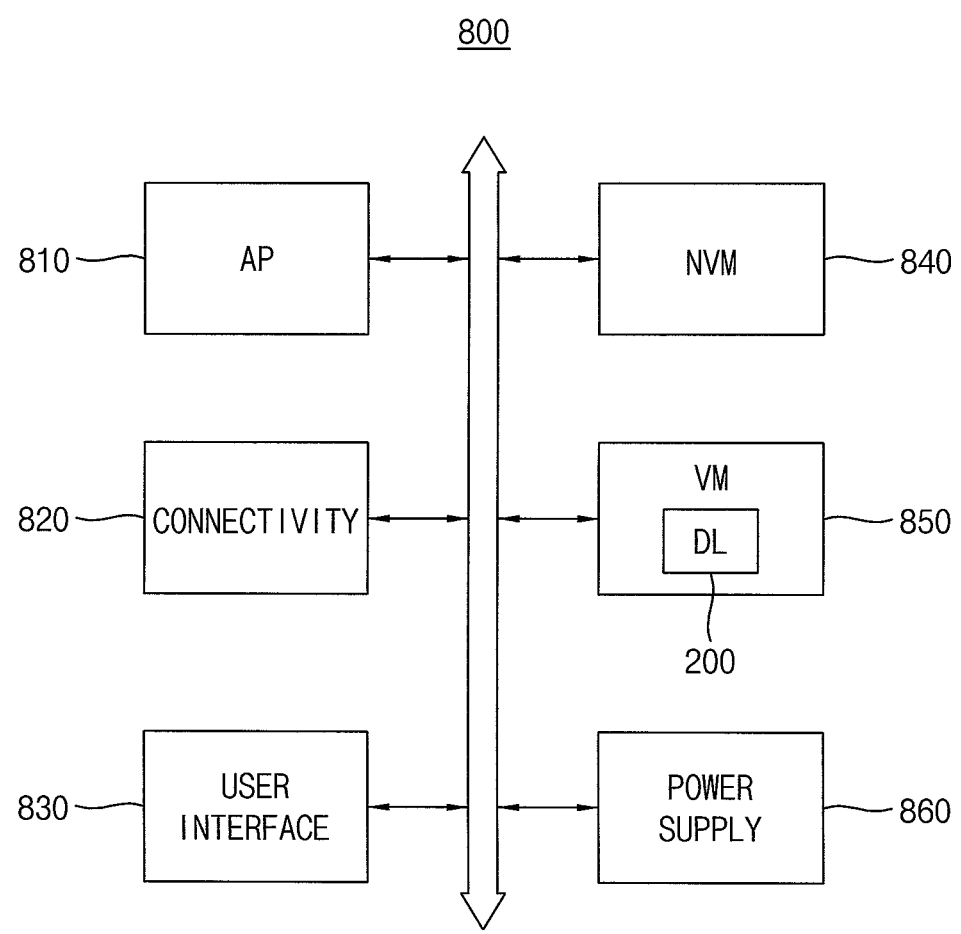
FIG. 26 illustrates a block diagram of an electronic device according to exemplary embodiments of the inventive concept.

FIG. 26 illustrates a block diagram of an electronic device according to exemplary embodiments of the inventive concept.

Referring to FIG. 26, an electronic device 800 includes an application processor AP 810, a connectivity circuit 820, a user interface 830, a nonvolatile memory device NVM 840, a volatile memory device VM 850, and a power supply 860. In some example embodiments, the electronic device 800 may be for example a mobile phone, a smart phone, a personal digital assistant (PDA), a portable multimedia player (PMP), a digital camera, a music player, a portable game console, a navigation system, or the like.

The application processor 810 may execute applications, such as for example a web browser, a game application, a video player, or the like. In some example embodiments, the application processor 810 may include a single core or multiple cores. For example, the application processor 810 may be a multi-core processor, such as a dual-core processor, a quad-core processor, a hexa-core processor, or the like. The application processor 810 may include an internal or external cache memory.

The connectivity circuit 820 may perform wired or wireless communication with an external device. For example, the connectivity circuit 820 may perform Ethernet communication, near field communication (NFC), radio frequency identification (RFID) communication, mobile telecommunication, memory card communication, universal serial bus (USB) communication, or other types of wireless communications. In some example embodiments, the connectivity unit 820 may include a baseband chipset that supports communications such as for example global system for mobile communications (GSM), general packet radio service (GPRS), wideband code division multiple access (WCDMA), high speed downlink/uplink packet access (HSxPA), or the like.

The volatile memory device 850 may store data processed by the application processor 810 or operate as a working memory. The volatile memory device 850 may include the delay line DL 200 of FIG. 7. For example, the volatile memory device 850 may be implemented with the memory device 600 of FIG. 25. A structure and an operation of the memory device 600 of FIG. 25 are described above with reference to FIGS. 1 to 25. Therefore, detail descriptions of the volatile memory device 850 are here omitted.

The nonvolatile memory device 840 may store a boot image for booting the electronic device 800. For example, the nonvolatile memory device 840 may be an electrically erasable programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), among other memory types.

The user interface 830 may include at least one input device, such as for example a keypad, a touch screen, or the like, and at least one output device such as for example a speaker, a display device, or the like. The power supply 860 may supply a power supply voltage to the electronic device 800.

In some embodiments, the electronic device 800 may further include an image processor, and/or a storage device, such as a memory card, a solid state drive (SSD), a hard disk drive (HDD), a CD-ROM, or the like.

In some embodiments, the electronic device 800 and/or components of the electronic device 800 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 27:
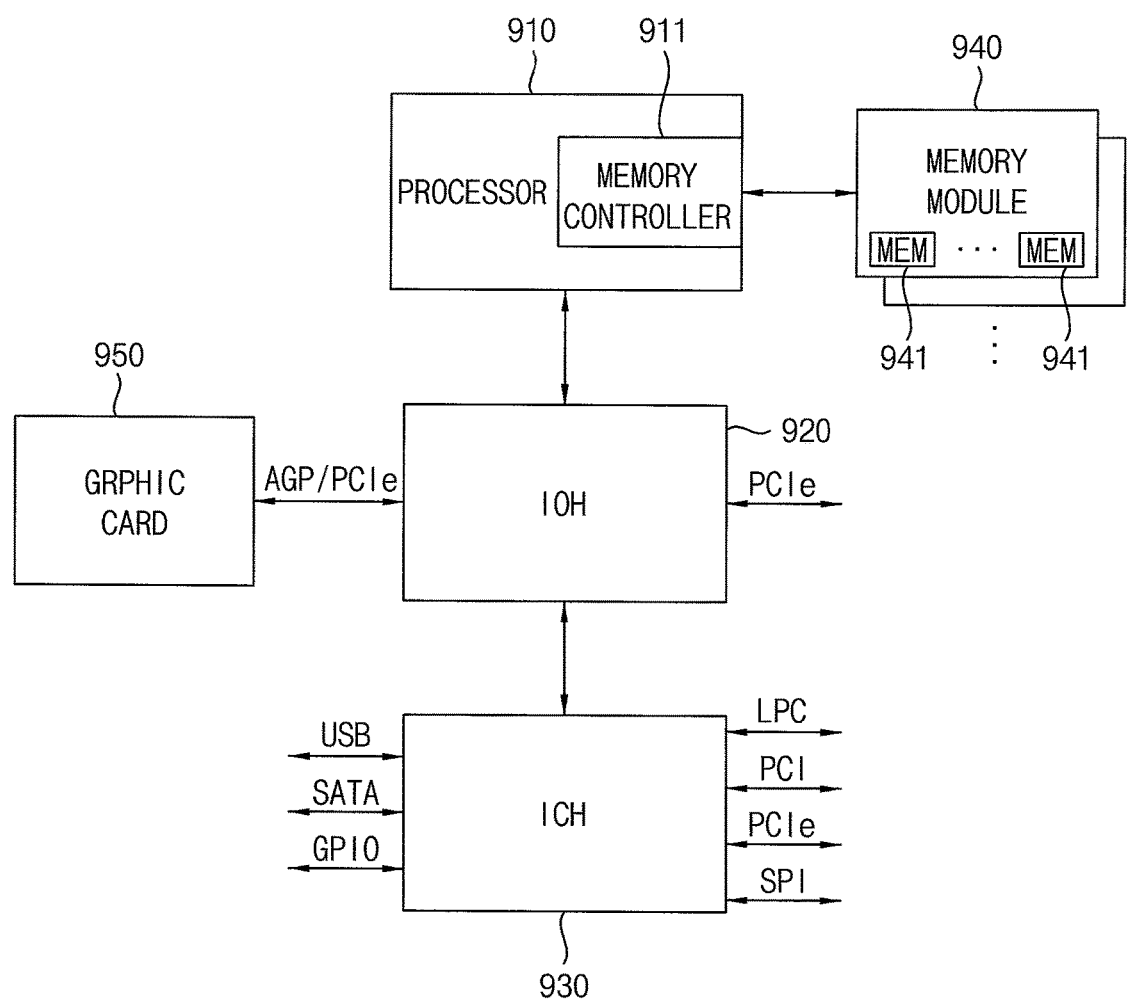
FIG. 27 illustrates a block diagram of a computing system according to exemplary embodiments of the inventive concept.

FIG. 27 illustrates a block diagram of a computing system according to exemplary embodiments.

Referring to FIG. 27, a computing system 900 includes a processor 910, an input/output hub (IOH) 920, an input/output controller hub (ICH) 930, at least one memory module 940, and a graphics card 950. In some example embodiments, the computing system 900 may be a personal computer (PC), a server computer, a workstation, a laptop computer, a mobile phone, a smart phone, a personal digital assistant (PDA), a portable multimedia player (PMP), a digital camera), a digital television, a set-top box, a music player, a portable game console, a navigation system, or the like.

The processor 910 may perform various computing functions, such as executing specific software for performing specific calculations or tasks. For example, the processor 910 may be a microprocessor, a central process unit (CPU), a digital signal processor, or the like. In some embodiments, the processor 910 may include a single core or multiple cores. For example, the processor 910 may be a multi-core processor, such as a dual-core processor, a quad-core processor, a hexa-core processor, or the like. Although FIG. 27 illustrates the computing system 900 including one processor 910, in some embodiments the computing system 900 may include a plurality of processors.

The processor 910 may include a memory controller 911 for controlling operations of the memory module 940. The memory controller 911 included in the processor 910 may be referred to as an integrated memory controller (IMC). A memory interface between the memory controller 911 and the memory module 940 may be implemented with a single channel including a plurality of signal lines, or may bay be implemented with multiple channels, to each of which at least one memory module 940 may be coupled. In some embodiments, the memory controller 911 may be located inside the input/output hub 920. The input/output hub 920 including the memory controller 911 may be referred to as memory controller hub (MCH).

The memory module 940 may include a plurality of memory devices MEM 941 that store data provided from the memory controller 911. The memory device 941 may include the delay line 200 of FIG. 7. For example, the memory device 941 may be implemented with the memory device 600 of FIG. 25. A structure and an operation of the memory device 600 of FIG. 25 are described above with reference to FIGS. 1 to 25. Therefore, detail descriptions of the memory device 941 are here omitted.

The input/output hub 920 may manage data transfer between processor 910 and devices, such as the graphics card 950. The input/output hub 920 may be coupled to the processor 910 via various interfaces. For example, the interface between the processor 910 and the input/output hub 920 may be a front side bus (FSB), a system bus, a HyperTransport, a lightning data transport (LDT), a Quick-Path interconnect (QPI), a common system interface (CSI), or the like. The input/output hub 920 may provide various interfaces with the devices. For example, the input/output hub 920 may provide an accelerated graphics port (AGP) interface, a peripheral component interface-express (PCIe), a communications streaming architecture (CSA) interface, or the like. Although FIG. 27 illustrates the computing system 900 including one input/output hub 920, in some embodiments, the computing system 900 may include a plurality of input/output hubs.

The graphics card 950 may be coupled to the input/output hub 920 via AGP or PCIe. The graphics card 950 may control a display device for displaying an image. The graphics card 950 may include an internal processor for processing image data and an internal memory device. In some embodiments, the input/output hub 920 may include an internal graphics device along with or instead of the graphics card 950 outside the graphics card 950. The graphics device included in the input/output hub 920 may be referred to as integrated graphics. Further, the input/output hub 920 including the internal memory controller and the internal graphics device may be referred to as a graphics and memory controller hub (GMCH).

The input/output controller hub 930 may perform data buffering and interface arbitration to efficiently operate various system interfaces. The input/output controller hub 930 may be coupled to the input/output hub 920 via an internal bus, such as a direct media interface (DMI), a hub interface, an enterprise Southbridge interface (ESI), PCIe, or the like.

The input/output controller hub 930 may provide various interfaces with peripheral devices. For example, the input/output controller hub 930 may provide a universal serial bus (USB) port, a serial advanced technology attachment (SATA) port, a general purpose input/output (GPIO), a low pin count (LPC) bus, a serial peripheral interface (SPI), PCI, PCIe, or the like.

In some embodiments, the processor 910, the input/output hub 920 and the input/output controller hub 930 may be implemented as separate chipsets or separate integrated circuits. In other embodiments, at least two of the processor 910, the input/output hub 920 and the input/output controller hub 930 may be implemented as a single chipset.

The foregoing is illustrative of the present inventive concept and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A delay line, comprising:
   a duty cycle adjust circuit configured to adjust a duty cycle of an input signal based on a first control signal and a second control signal, and to invert the input signal to generate a first internal signal;
   a fine delay circuit configured to delay the first internal signal based on a third control signal, and to invert the first internal signal to generate a second internal signal; and
   a coarse delay circuit configured to delay the second internal signal based on a fourth control signal to generate an output signal,
   wherein the duty cycle adjust circuit comprises at least one delay cell coupled in series, and the at least one delay cell operates based on the first control signal and the second control signal, and
   wherein the fine delay circuit comprises a plurality of delay cells coupled in series, and the plurality of delay cells operate based on the third control signal.

2. The delay line of claim 1, wherein each of a number of the at least one delay cell included in the duty cycle adjust circuit and a number of the plurality of delay cells included in the fine delay circuit correspond to an odd number, and
   wherein the at least one delay cell included in the duty cycle adjust circuit and each of the plurality of delay cells included in the fine delay circuit have a same structure.

3. The delay line of claim 2, wherein each of the at least one delay cell included in the duty cycle adjust circuit is configured to independently adjust a delay time of a rising edge and a delay time of a falling edge of a received signal based on the first control signal and the second control signal, and
   wherein each of the plurality of delay cells included in the fine delay circuit is configured to equally adjust a delay time of a rising edge and a delay time of a falling edge of a received signal based on the third control signal.

4. The delay line of claim 2, wherein each of a number of bits included in the first control signal and a number of bits included in the second control signal is the same as the number of the at least one delay cell included in the duty cycle adjust circuit, and each of the at least one delay cell included in the duty cycle adjust circuit receives a respective bit of the first control signal and a respective bit of the second control signal, and
   wherein a number of bits included in the third control signal is the same as the number of the plurality of delay cells included in the fine delay circuit, and each of the plurality of delay cells included in the fine delay circuit receives a respective bit of the third control signal.

5. The delay line of claim 2, wherein each of the at least one delay cell included in the duty cycle adjust circuit comprises:
   a first inversion circuit configured to invert an internal input signal, an output electrode of the first inversion circuit being coupled to a first node;
   a second inversion circuit configured to selectively invert a rising edge of the internal input signal and a falling edge of the internal input signal based on the first control signal and the second control signal, an output electrode of the second inversion circuit being coupled to the first node;
   a third inversion circuit configured to invert a signal at the first node, an output electrode of the third inversion circuit being coupled to a second node;
   a fourth inversion circuit configured to selectively invert a rising edge of the signal at the first node and a falling edge of the signal at the first node based on the first control signal and the second control signal, an output electrode of the fourth inversion circuit being coupled to the second node; and
   a fifth inversion circuit configured to invert a signal at the second node to generate an internal output signal.

6. The delay line of claim 5, wherein the second inversion circuit comprises:
   a first inverter configured to invert the internal input signal, an output electrode of the first inverter being the output electrode of the second inversion circuit;
   a first switch coupled between a supply voltage and the first inverter, the first switch configured to be turned on in response to the first control signal; and
   a second switch coupled between a ground voltage and the first inverter, the second switch configured to be turned on in response to the second control signal, and wherein the fourth inversion circuit comprises
a second inverter configured to invert the signal at the first node, an output electrode of the second inverter being the output electrode of the fourth inversion circuit;
a third switch coupled between the supply voltage and the second inverter, the third switch configured to be turned on in response to the second control signal; and
a fourth switch coupled between the ground voltage and the second inverter, the fourth switch configured to be turned on in response to the first control signal.

7. The delay line of claim 5, wherein the second inversion circuit comprises:
a first p-type metal oxide semiconductor (PMOS) transistor coupled between a supply voltage and a third node, the first PMOS transistor including a first gate connected to the first control signal;
a second PMOS transistor coupled between the third node and the first node, the second PMOS transistor including a second gate connected to the internal input signal;
a first n-type metal oxide semiconductor (NMOS) transistor coupled between a ground voltage and a fourth node, the first NMOS transistor including a third gate connected to an inverted version of the second control signal; and
a second NMOS transistor coupled between the fourth node and the first node, the second NMOS transistor including a fourth gate connected to the internal input signal, and
wherein the fourth inversion circuit comprises
a third PMOS transistor coupled between the supply voltage and a fifth node, the third PMOS transistor including a fifth gate connected to the second control signal;
a fourth PMOS transistor coupled between the fifth node and the second node, the fourth PMOS transistor including a sixth gate coupled to the first node;
a third NMOS transistor coupled between the ground voltage and a sixth node, the third NMOS transistor including a seventh gate connected to an inverted version of the first control signal; and
a fourth NMOS transistor coupled between the sixth node and the second node, the fourth NMOS transistor including an eighth gate coupled to the first node.

8. The delay line of claim 5, wherein each of the plurality of delay cells included in the fine delay circuit comprises:
a first inversion circuit configured to invert an internal input signal, an output electrode of the first inversion circuit being coupled to a first node;
a second inversion circuit configured to be turned on in response to the third control signal and to invert the internal input signal when turned on, an output electrode of the second inversion circuit being coupled to the first node;
a third inversion circuit configured to invert a signal at the first node, an output electrode of the third inversion circuit being coupled to a second node;
a fourth inversion circuit configured to be turned on in response to the third control signal and to invert the signal at the first node when turned on, an output electrode of the fourth inversion circuit being coupled to the second node; and
a fifth inversion circuit configured to invert a signal at the second node to generate an internal output signal.

9. The delay line of claim 8, wherein the second inversion circuit comprises:
a first inverter configured to invert the internal input signal, an output electrode of the first inverter being the output electrode of the second inversion circuit;
a first switch coupled between a supply voltage and the first inverter, the first switch configured to be turned on in response to the third control signal; and
a second switch coupled between a ground voltage and the first inverter, the second switch configured to be turned on in response to the third control signal, and
wherein the fourth inversion circuit comprises
a second inverter configured to invert the signal at the first node, an output electrode of the second inverter being the output electrode of the fourth inversion circuit;
a third switch coupled between the supply voltage and the second inverter, the third switch configured to be turned on in response to the third control signal; and
a fourth switch coupled between the ground voltage and the second inverter, the fourth switch configured to be turned on in response to the third control signal.

10. The delay line of claim 8, wherein the second inversion circuit comprises:
a first p-type metal oxide semiconductor (PMOS) transistor coupled between a supply voltage and a third node, the first PMOS transistor including a first gate connected to the third control signal;
a second PMOS transistor coupled between the third node and the first node, the second PMOS transistor including a second gate connected to the internal input signal;
a first n-type metal oxide semiconductor (NMOS) transistor coupled between a ground voltage and a fourth node, the first NMOS transistor including a third gate connected to an inverted version of the third control signal; and
a second NMOS transistor coupled between the fourth node and the first node, the second NMOS transistor including a fourth gate connected to the internal input signal, and
wherein the fourth inversion circuit comprises
a third PMOS transistor coupled between the supply voltage and a fifth node, the third PMOS transistor including a fifth gate connected to the third control signal;
a fourth PMOS transistor coupled between the fifth node and the second node, the fourth PMOS transistor including a sixth gate coupled to the first node;
a third NMOS transistor coupled between the ground voltage and a sixth node, the third NMOS transistor including a seventh gate connected to the inverted version of the third control signal; and
a fourth NMOS transistor coupled between the sixth node and the second node, the fourth NMOS transistor including an eighth gate coupled to the first node.

11. A delay line, comprising:
a duty cycle adjust circuit configured to adjust a duty cycle of an input signal based on a first control signal and a second control signal, and to invert the input signal to generate a first internal signal;
a fine delay circuit configured to delay the first internal signal based on a third control signal, and to invert the first internal signal to generate a second internal signal; and
a coarse delay circuit configured to delay the second internal signal based on a fourth control signal to generate an output signal, wherein the fine delay circuit is configured to adjust a delay time of the first internal signal by units of a first unit delay based on the third control signal, and wherein the coarse delay circuit is configured to adjust a delay time of the second internal signal by units of a second unit delay which is longer than the first unit delay, based on the fourth control signal.

12. The delay line of claim 11, wherein the fine delay circuit comprises a plurality of delay cells coupled in series, a number of the plurality of delay cells included in the fine delay circuit is P, the second unit delay is D, and the first unit delay corresponds to D/(P+1).

13. The delay line of claim 1, wherein each of a number of the at least one delay cell included in the duty cycle adjust circuit and a number of the plurality of delay cells included in the fine delay circuit correspond to an odd number.

14. The delay line of claim 1, wherein the at least one delay cell included in the duty cycle adjust circuit and each of the plurality of delay cells included in the fine delay circuit have a same structure.

* * * * *